United States Patent
Yoon et al.

(10) Patent No.: US 10,707,079 B2
(45) Date of Patent: Jul. 7, 2020

(54) ORTHOGONAL PATTERNING METHOD

(71) Applicant: GWANGJU INSTITUTE OF SCIENCE AND TECHNOLOGY, Gwangju (KR)

(72) Inventors: Myung Han Yoon, Gwangju (KR); Su Jin Sung, Ulsan (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 287 days.

(21) Appl. No.: 15/503,970

(22) PCT Filed: Aug. 13, 2015

(86) PCT No.: PCT/KR2015/008484
§ 371 (c)(1),
(2) Date: Feb. 14, 2017

(87) PCT Pub. No.: WO2016/024823
PCT Pub. Date: Feb. 18, 2016

(65) Prior Publication Data
US 2017/0236706 A1    Aug. 17, 2017

Related U.S. Application Data

(60) Provisional application No. 62/037,123, filed on Aug. 14, 2014, provisional application No. 62/061,146, filed on Oct. 8, 2014.

(30) Foreign Application Priority Data

May 13, 2015    (KR) .......................... 10-2015-0066586

(51) Int. Cl.
*H01L 21/027* (2006.01)
*H01L 27/12* (2006.01)
(Continued)

(52) U.S. Cl.
CPC .... *H01L 21/0272* (2013.01); *H01L 21/02118* (2013.01); *H01L 21/02288* (2013.01);
(Continued)

(58) Field of Classification Search
CPC ......... H01L 21/02118; H01L 21/02288; H01L 21/0272; H01L 51/0023; H01L 27/1225;
(Continued)

(56) References Cited

U.S. PATENT DOCUMENTS 8,852,979 B2 * 10/2014 Min ...................... H01L 51/428
257/E21.001
9,034,737 B2    5/2015 van Meer et al.
(Continued)

FOREIGN PATENT DOCUMENTS

CN    102169959 A    8/2011
CN    103261088 A    8/2013
(Continued)

OTHER PUBLICATIONS

Chinese Office Action dated Oct. 16, 2018 for corresponding Chinese Application No. 2018101101789160, citing the above references.
(Continued)

*Primary Examiner* — Savitri Mulpuri
(74) *Attorney, Agent, or Firm* — Hauptman Ham, LLP

(57) ABSTRACT

The present invention relates to a method for forming a layer, to be patterned, of an element by using a fluorinated material, which has orthogonality, and a solvent, the method comprising: a first step of printing with the fluorinated material so as to form, on a surface of a substrate, a mask template provided with an exposure part and a non-exposure part; a second step of coating the exposure part with a material to be patterned; a the third step of lifting-off the
(Continued)

non-exposure part with the fluorinated solvent so as to form the layer to be patterned in the exposure part.

16 Claims, 22 Drawing Sheets

(51) Int. Cl.
*H01L 51/00* (2006.01)
*H01L 21/02* (2006.01)
*H01L 21/311* (2006.01)
*H01L 51/56* (2006.01)
*H01L 27/32* (2006.01)

(52) U.S. Cl.
CPC .... *H01L 21/31111* (2013.01); *H01L 27/1225* (2013.01); *H01L 27/1288* (2013.01); *H01L 51/0023* (2013.01); *H01L 21/0212* (2013.01); *H01L 27/3211* (2013.01); *H01L 51/0016* (2013.01); *H01L 51/56* (2013.01)

(58) Field of Classification Search
CPC .......... H01L 27/1288; H01L 21/31111; H01L 51/56; H01L 21/0212; H01L 27/3211; H01L 51/0016
See application file for complete search history.

(56) References Cited

U.S. PATENT DOCUMENTS

| | | | | |
|---|---|---|---|---|
| 9,122,167 B2* | 9/2015 | Defranco | ............ | G03F 7/0046 |
| 9,298,088 B2* | 3/2016 | Robello | ................ | G03F 7/027 |
| 9,691,985 B2* | 6/2017 | Bain | .................... | H01L 51/107 |
| 2009/0076430 A1* | 3/2009 | Simpson | ............... | A61F 13/022 |
| | | | | 602/42 |
| 2010/0289019 A1 | 11/2010 | Katz et al. | | |
| 2011/0171584 A1* | 7/2011 | Suh | ...................... | H01L 51/0016 |
| | | | | 430/319 |
| 2011/0317429 A1* | 12/2011 | Aiba | .................... | H01L 51/5265 |
| | | | | 362/296.01 |
| 2012/0280216 A1 | 11/2012 | Sirringhaus et al. | | |
| 2014/0057379 A1* | 2/2014 | Park | ........................ | G03F 7/094 |
| | | | | 438/46 |
| 2014/0329354 A1* | 11/2014 | Defranco | ................ | H01L 51/56 |
| | | | | 438/82 |
| 2016/0218326 A1* | 7/2016 | Fleissner | ................ | H01L 51/56 |
| 2016/0349614 A1* | 12/2016 | Wright | .................. | G03F 7/0046 |
| 2017/0222148 A1* | 8/2017 | Defranco | ................. | G03F 7/40 |
| 2017/0236706 A1* | 8/2017 | Yoon | ...................... | H01L 51/56 |
| | | | | 438/478 |
| 2017/0256754 A1* | 9/2017 | Defranco | ................ | H01L 51/56 |
| 2018/0355466 A1* | 12/2018 | Mu | ....................... | C23C 14/042 |

FOREIGN PATENT DOCUMENTS

| | | |
|---|---|---|
| JP | H08316193 A | 11/1996 |
| JP | 2009-087760 A | 4/2009 |
| JP | 2011-141526 A | 7/2011 |
| KR | 10-2011-0082415 A | 7/2011 |
| KR | 10-2013-0129926 A | 11/2013 |
| KR | 10-1407209 B1 | 6/2014 |
| KR | 10-1463290 B1 | 12/2014 |

OTHER PUBLICATIONS

Korean Office Action dated Jun. 11, 2018, corresponding to Korean Application No. 10-2017-7006989, citing the above reference(s).

* cited by examiner

<PRIOR ART>

FIG. 3

| PRINTING METHOD | INK VISCOSITY (cP) | FINENESS (μm) | WIRE THICKNESS (μm) | PRODUCTION SPEED (m/min) |
|---|---|---|---|---|
| INKJET | SEVERAL TO 20 | 30 TO 50 (ELECTROSTATIC EJECTION) | TO 1 (SEVERAL TENS OF μm TO SEVERAL HUNDREDS OF μm CAN BE USED VIA OVERLAP) | LOW SPEED (CONTINUOUS TYPE CAN BE – 10 M/X) |
| OFFSET | 100 TO SEVERAL TEN THOUSANDS | 10 TO | TO SEVERAL TENS | INTERMEDIATE TO HIGH SPEED TO 1,000 |
| GRAVURE | 100 TO 1,000 | 10 TO 50 | TO 1 | HIGH SPEED TO 1,000 |
| FLEXO | 50 TO 500 | 45 TO 100 | 1 TO | HIGH SPEED TO 500 |
| SCREEN | 500 TO 5,000 | SEVERAL TENS TO (HIGHLY FINE:TO10) | 5 TO 100 | INTERMEDIATE SPEED TO 70 |

(a)      (b)      (c)      (d)

(a)          (b)

(a)            (b)

FIG. 19
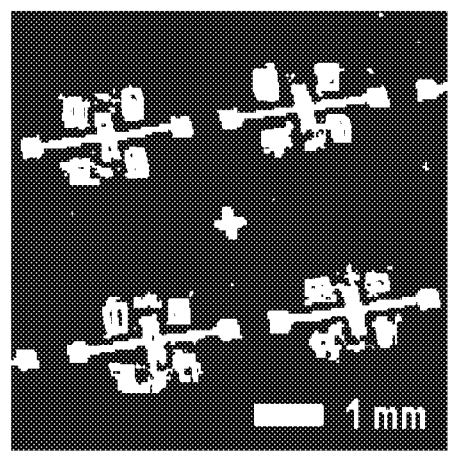 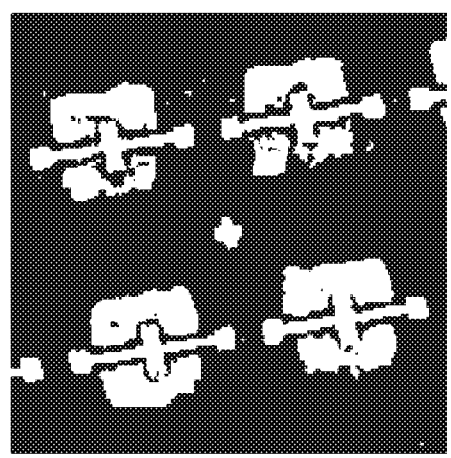
(a) (b)

(a)          (b)

FIG. 22
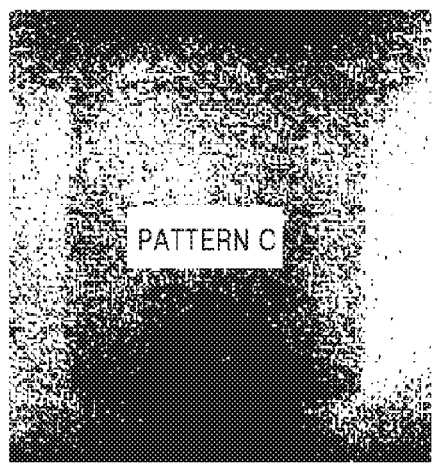 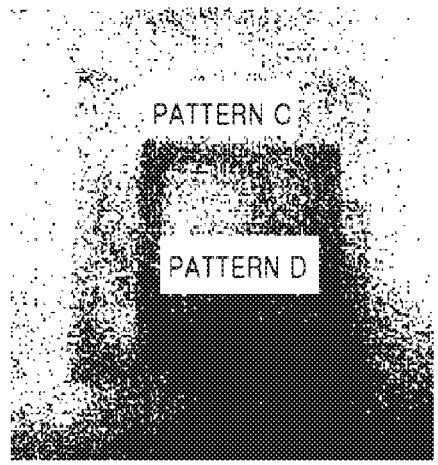
(a)                      (b)

ORTHOGONAL PATTERNING METHOD

CROSS REFERENCE TO RELATED APPLICATION

This application is the National Phase Application of International Application No. PCT/KR2015/008484, filed on Aug. 13, 2015, which designates the United States and was published in Korean. The International Application claims the priority of Korean Patent Application No. 10-2015-0066586 filed on May 13, 2015, in the KIPO (Korean Intellectual Property Office). The International Application also claims the priority to the U.S. Provisional Application No. 62/061,146 filed on Oct. 08, 2014 and U.S. Provisional Application No. 62/037,123 filed on Aug. 14, 2014. Further, all of the priority documents are hereby incorporated by reference in their entirety.

TECHNICAL FIELD

The present disclosure relates to a patterning method, and more particularly, to an orthogonal patterning method for forming a pattern target layer of a device using a fluorinated material and solvent with orthogonality.

BACKGROUND ART

It is required to apply a technology for forming a fine pattern to a fabrication process of various optoelectronic devices such as a semiconductor device, an organic light emitting diode (OLED) device, and a light emitting diode (LED) device. This is because desired fine patterns need to be formed according to various necessities such as driving circuit formation, pixel formation, and electrode formation of a device.

In addition, in the case of a biosensor that uses or does not use electricity except for the optoelectronic device, a fine pattern needs to be formed.

In general, as such a technology for forming a fine pattern, various methods such as photolithography, a shadow mask, and printing have been used according to a pattern shape, a pattern condition, and so on. However, the methods have their advantages and disadvantages, one method is not commonly applied to form all types of fine patterns and, an optimal method is generally selected inconsideration of cost utility analysis according to an applied example.

Photolithography is used to form a circuit via a method of applying a thin photoresist with photosensitivity onto a substrate, placing a desired mask pattern over the substrate and, then, applying light to the resultant structure, which is similar to photography, and goes through the following processes.

FIG. 1 is a schematic diagram illustrating a patterning method via general photolithography. As illustrated in FIG. 1, a pattern target material is coated on a surface of a substrate and, then, a photosensitive material is coated on the substrate. Then, a desired mask pattern is put on the resultant structure, an exposure process of irradiating with ultraviolet (UV) light is performed and, then, the photosensitive material is selectively removed using a developing solution. Then, the pattern target material is selectively etched and, then, the photosensitive material on the pattern target material is removed to form a desired pattern. However, photolithography has various problems in that the aforementioned complicated processes are required and the problems will be described below in detail.

The shadow mask is a thin metallic plate with numerous small holes and is used in vapor deposition. A fine metal mask (FMM) of the shadow mask is used for deposition of an organic material with a fine pattern on a large substrate. Accordingly, when the FMM is used, a plurality of desired fine patterns of an organic material may be formed at desired locations of a substrate in one go. For deposition of an organic material with a desired pattern, the FMM may include a plurality of rectangular slots or stripe-type slits through which an organic material passes. Here, the plurality of rectangular slots or stripe-type slits may constitute a unit masking portion and the FMM may include a plurality of unit masking portions. A deposition technology using the FMM may be used to deposit an organic material and to form a cathode in order to manufacture a large-area OLED display device or the like.

In order to manufacture a large-area OLED display device, a large-area substrate is required. However, in the case of a large-area substrate, the substrate may be bent. Accordingly, since an interval between the substrate and a mask is not uniform, there is a problem in that an accurate pattern is not formed at a desired location, resulting in forming defective devices.

Accordingly, there is a limit in manufacture of a large-area OLED display device using a deposition technology using an FMM. That is, when an organic emission layer or a cathode layer is formed on a substrate using the FMM, there is a limit in extending the layer to a large area substrate.

As an organic emission layer needs to be formed in the thin film form, the FMM also needs to be thin. However, when the FMM is thin, manufacture and design in consideration of the case in which the FMM is bent due to external force or self load are difficult and, also, there is a limit in forming the FMM to a thickness equal to or less than 10 μm. That is, when a conventional method using a mask such as an FMM is used, there is a limit in forming an organic emission layer as a thin film.

When a metal mask such as an FMM is used, an organic material is deposited through an open pixel and, in this regard, when the metal mask is repeatedly used for a predetermined time period, the organic material is deposited on the open pixel, changing a pattern size. Accordingly, there is a problem in that a metal mask needs to be replaced at a predetermined period.

As described above, when an FMM scheme is used, there is a significant limit in forming a desired pixel according to a shadowing effect (dead space is generated) during pixel formation due to reasons such as the thickness of a metal mask and an interval with a substrate.

Recently, with regard to manufacture of an optoelectronic device, industrial applications of a single molecule-based high-purity organic material, inorganic material, or hybrid material have drawn attention. In particular, industrial applications of an organic semiconductor based on a deposition-based single molecule or printable polymer have drawn attention due to light, inexpensive, and mechanically flexible characteristics and, as device integration is required, fine patterning of a material of a pattern target layer (active layer) of an organic material has been considered as a very important technology.

As described above, examples of the patterning technology of an organic material broadly include a method using a shadow mask in vapor deposition and a photolithography using a photoresist.

In the case of patterning an organic material using a shadow mask in vapor deposition, it is disadvantageously difficult to pattern the organic material with a high resolution and a high yield for the aforementioned reasons during manufacture of a large-area electronic device array. In addition, when an organic material is patterned using the photolithography method of FIG. 1, it is difficult to pattern an organic material using this method in reality due to dissolution or modification of an organic active layer during coating, developing, and removing processes of a photosensitizer as well as expensive equipment and complicated processes.

Recently, a metal oxide-based material that has optical transparency and high performance and is reported to have excellent stability compared with an organic material has been actively developed. In particular, a metal oxide material for allowing a solution process has drawn attention in that the material is easily applied to a simple process and a large-area. In addition, a metal oxide material has been more actively applied and used in industrial fields related to semiconductor devices and, as integration of devices is required, a material patterning technology has been very importantly considered.

A main method of the patterning technology of the metal oxide material is the aforementioned photolithography method. Although the photolithography method permits high-resolution fine patterning, there are problems in that expensive equipment is required and complicated processes such as coating, exposure, developing, and etching of a photosensitizer are accompanied and, in particular, the material may be dissolved and modified due to material and solvents in processes. In particular, the photolithography method has an actual limit in application to a large-area display market that has been currently and remarkably developed.

Recently, a complicated integration circuit with a multilayer structure or the like has been required to be manufactured. That is, an electronic device has been generally required to be patterned with a high resolution. When a photolithography method is used, it is easy to pattern a general organic and inorganic material. However, it is almost impossible to pattern an organic material using a photolithography method for reasons such as degraded performance of the organic material during deposition and removal of a photoresist due to a solvent used during a patterning process. In the case of patterning an organic material using a shadow mask in vapor deposition, in particular, with regard to manufacture of a large-area electronic device array, it is disadvantageously difficult to achieve multiple-patterning with a high resolution and a high yield for the aforementioned reason.

Korean Patent No. 1463290 discloses a technology that uses the orthogonality of a material and is used to pattern a fluorine (F)-containing material using a photolithography process.

US Patent No. 2010-0289019 discloses a technology that uses a photolithography process and uses CYTOP as a protective layer of an organic semiconductor. U.S. Pat. No. 9,034,737 discloses a technology that uses a photolithography process and uses CYTOP as a protective layer of a photoelectron material.

That is, the above patent documents disclose a technology that uses CYTOP and so on with orthogonality and is used in patterning using a photolithography process. However, as the photolithography process is used, complicated processes such as coating, exposure, developing, and etching of a photosensitizer are required and, also, there is a limit in achieving a large area.

Microelectronic Engineering 123 (2014) 33-37 (Preparation of fluoropolymer structures for orthogonal processing of diverse material by Micro-Contact Printing) discloses a technology that does not uses a photolithography process and is used to transcribe only a desired portion of a polymer film coated on an elastic mold on a substrate via an implant method after a micro contact printing method. The technology does not use a photolithography process and, thus, is capable of simplifying processes but, as the implant method and the micro contact printing method using a mold are used, patterning in a local region is possible but there is a limit in achieving a large area. When the micro contact printing method and/or the implant method are used, a pattern is transcribed on a surface of a substrate while pushing the surface of the substrate at a predetermined pressure and, thus, when the surface of the substrate is pushed at a predetermined pressure or more, there is a problem in that a separate functional layer formed on the surface of the substrate is damaged.

Accordingly, there is a need for a technology of patterning an organic material, an inorganic material, or a hybrid material on a surface of a substrate via a simple process with a high yield and a high resolution. In addition, there is a need for a technology of forming various patterns as a multiple pattern in a right and left direction or forming various patterns as a multilayer pattern in an upper and lower direction as well as for achieving a large area.

DISCLOSURE

Technical Problem

It is an object of the present disclosure to provide an orthogonal patterning method of forming a pattern target layer of a device using a fluorinated material and solvent with orthogonality and patterning an organic material, an inorganic material, or a hybrid material on a surface of a substrate with a high yield and a high resolution via a simple process.

It is another object of the present disclosure to provide an orthogonal patterning method of forming a pattern target layer with various types of organic materials, inorganic materials, or hybrid materials on a surface of a substrate so as to apply the pattern target layer in various fields.

It is another object of the present disclosure to provide an orthogonal patterning method of forming various patterns as multiple patterns or multilayer patterns in an upper and lower directions as well as for achieving a large area as a mask template including an exposed portion and a non-exposed portion is formed on a surface of a substrate using a simple printing process.

Technical Solution

In accordance with one aspect of the present disclosure, an orthogonal patterning method of forming a pattern target layer of a device using a fluorinated material and solvent with orthogonality includes a first step of printing the fluorinated material to form a mask template including an exposed portion and a non-exposed portion on a surface of a substrate, a second step of coating the exposed portion with a pattern target material, and a third step of lifting-off the non-exposed portion using the fluorinated solvent to form the pattern target layer on the exposed portion.

Advantageous Effects

The present disclosure is capable of forming a pattern target layer of a device using a fluorinated material and solvent with orthogonality and advantageously patterning an organic material, an inorganic material, or a hybrid material on a surface of a substrate via a simple process with a high yield and a high resolution.

The present disclosure is capable of advantageously forming a pattern target layer with various types of organic materials, inorganic materials, or hybrid materials on a surface of a substrate to apply the pattern target layer to various fields.

The present disclosure is capable of forming various patterns as multilayer patterns or multiple patterns in an upper and lower direction as well as achieving a large area as a mask template including an exposed portion and a non-exposed portion is formed on a surface of a substrate using a simple printing process.

DESCRIPTION OF DRAWINGS

FIG. 3 is a table showing comparison of printing methods applied to the present disclosure.

FIG. 19 shows optical microscopic images of a thin film of oxide semiconductors that are patterned using a conventional photolithography method and an orthogonal patterning method according to the present disclosure, respectively.

FIG. 22 is an optical microscopic image captured during an experimental process in which multilayer patterning is performed in an upper and lower direction using an orthogonal patterning method according to the present disclosure.

BEST MODE

First, a concept of an orthogonal patterning method according to the present disclosure will be described.

Figure 1:
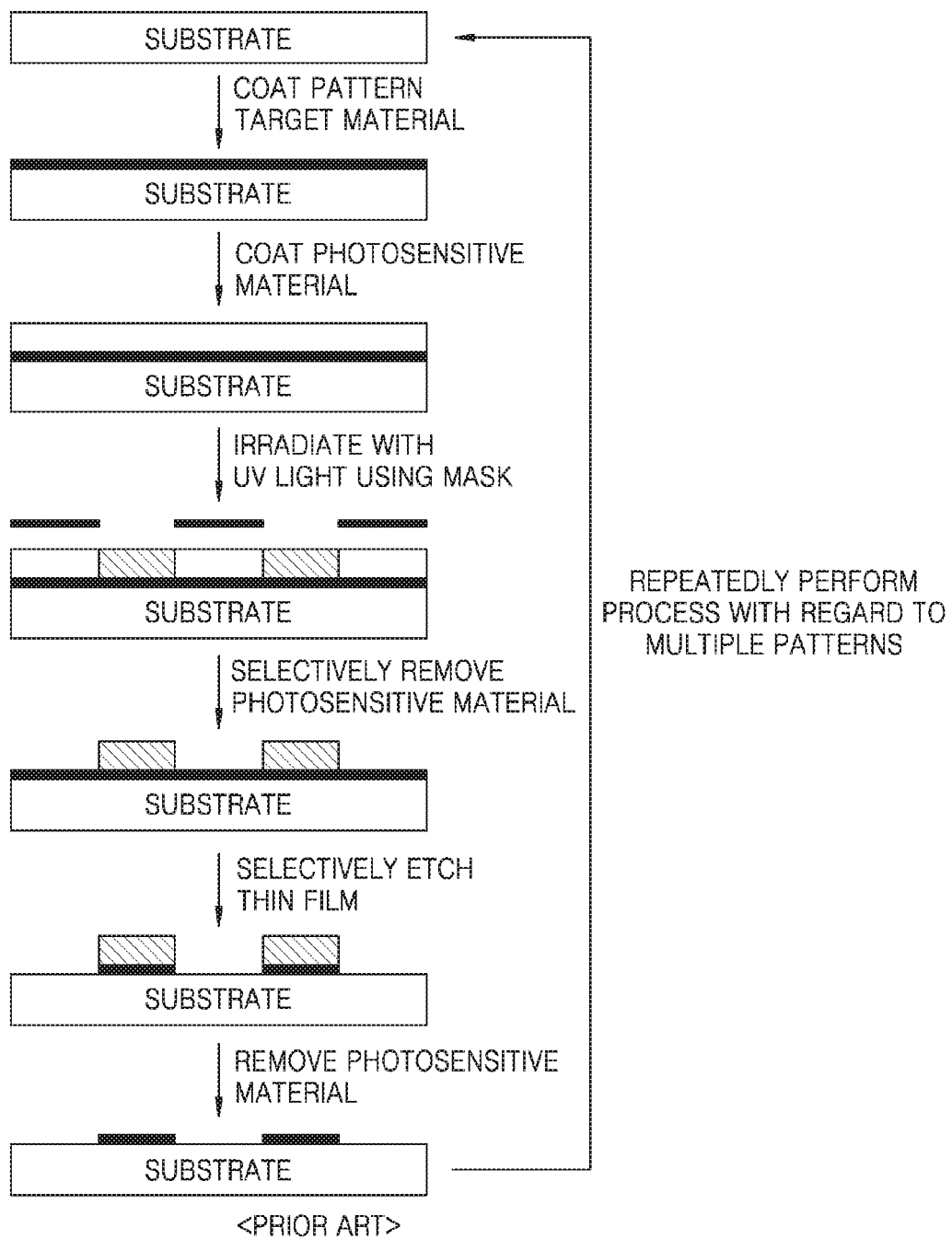
FIG. 1 is a schematic diagram illustrating a patterning method via general photolithography.
Figure 2:
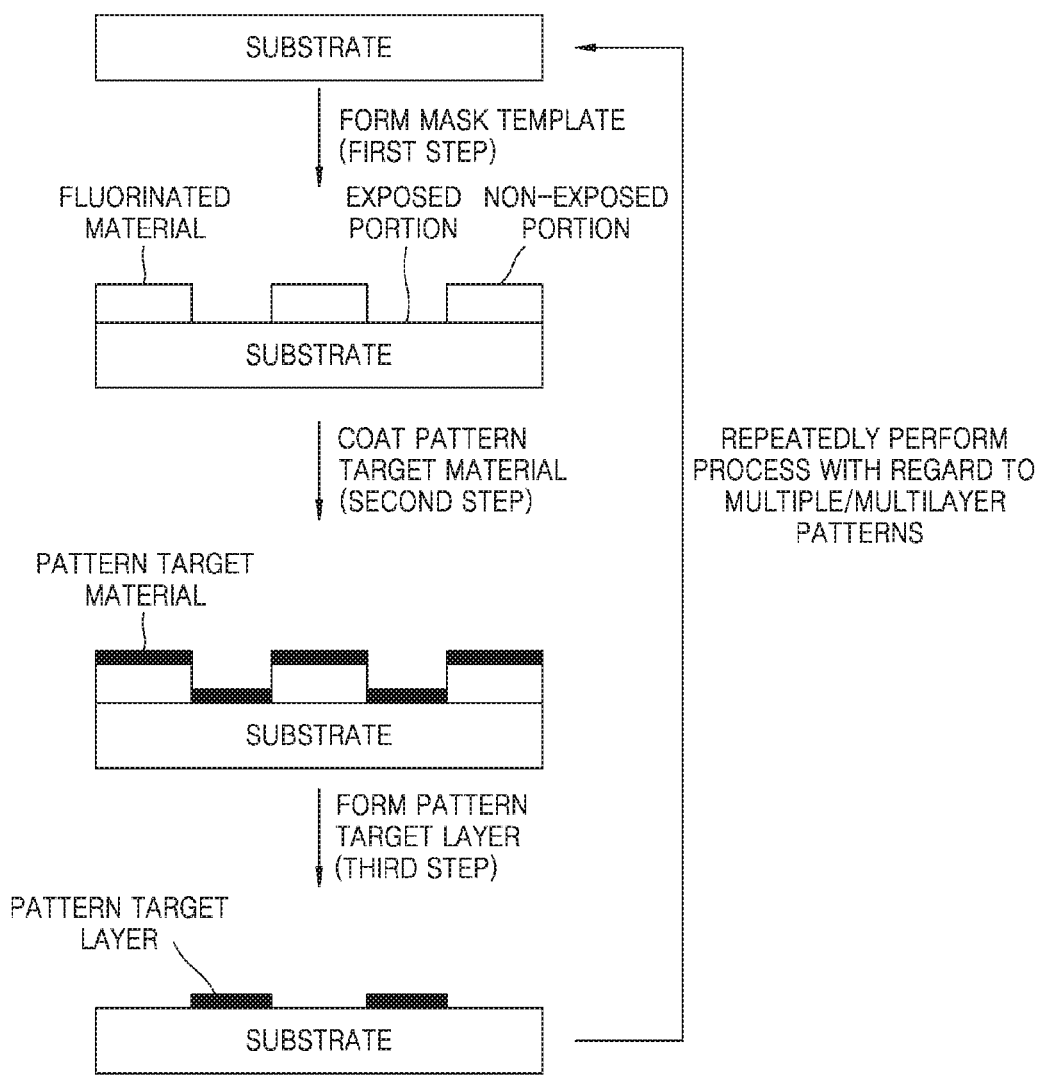
FIG. 2 is a schematic diagram illustrating an orthogonal patterning method according to the present disclosure.

FIG. 2 is a schematic diagram illustrating an orthogonal patterning method according to the present disclosure. As illustrated in FIG. 2, the orthogonal patterning method according to the present disclosure may be used to form a pattern target layer of a device using a fluorinated material and solvent with orthogonality and may include a first step of printing the fluorinated material to form a mask template including an exposed portion and a non-exposed portion on a surface of a substrate, a second step of coating the exposed portion with a pattern target material, and a third step of lifting-off the non-exposed portion using the fluorinated solvent to form the pattern target layer on the exposed portion.

Hereinafter, a technology overview, the features of steps and additional steps, and so on will be described in detail with regard to the present disclosure.

1. Technology Overview

The present disclosure discloses a method without chemical damage and physical damage of a pattern target layer. Accordingly, according to the present disclosure, a material with orthogonality may be applied to prevent chemical damage and differentiated printing processes may be applied according to a substrate type or whether multiple patterns or multilayer patterns are to be formed to prevent physical damage.

The present disclosure may be applied to various devices. That is, the present disclosure may also be applied to various optoelectronic devices (a semiconductor device, a display device, an organic light emitting diode (OLED) device, a light emitting diode (LED) device, and so on) and a device that uses or does not use electricity, such as a biosensor and/or a cell detector.

The present disclosure employs orthogonality whereby materials are nearly completely unaffected by each other or an influence on the materials is minimized. A fluorinated material (fluorinated solution) is not mixed with a non-polar organic solution and an aqueous solution and the materials are nearly completely unaffected by each other. Accordingly, according to the present disclosure, in order to use the fluorinated orthogonality, a fluorinated material and solvent may be used.

The fluorinated material according to the present disclosure may refer to any carbon-based material with a carbon-fluorine (C—F) bond and may be interpreted as including any material in which a fluorine atom is contained in a molecule. The fluorinated material according to the present disclosure may include a perfluorinated material that refers to a material in which all hydrogen atoms of a fluorinated material are substituted with fluorine atoms and are completely fluorinated.

The fluorinated material may refer to a material that includes hydrocarbon because every hydrogen atom is not substituted with a fluorine atom, i.e., a material that is not completely fluorinated. On the other hand, the perfluorinated material may refer to a material that is completely fluorinated because all hydrogen atoms are substituted with fluorine atoms.

However, the present disclosure relates to a patterning technology using the fluorinated orthogonality. Accordingly, in the case of a material that is not completely fluorinated, the orthogonality may not be perfect and a pattern target layer may be damaged to some degree during a lift-off process of removing a non-exposed portion of a mask template. That is, when the fluorinated material is used, the pattern target layer may be damaged by a fluorinated solvent used to remove the fluorinated material included in the non-exposed portion of the mask template. Accordingly, according to the present disclosure, a perfluorinated material of a fluorinated material may be used.

The perfluorinated material may include CYTOP (which is a brand name). Teflon (which is a brand name), polytetrafluoroethylene (PTFE), perfluoroethylene-propylene copolymer (FEP), perfluoroalkoxy alkanes (PFAs), and so on. For example, CYTOP may include "CYTOP CTL-809M" formed by mixing poly-1,1,2,4,4,5,5,6,7,7-decafluoro-3-oxa-1,6-heptadiene and perfluorotrialkylamine. In addition, Teflon may include "Teflon-AF" that is poly[4,5-difluoro-2,2-bis(trifluorodimethyl)-1,3-dioxole-co-tetrafluorodethylene].

The fluorinated solvent according to the present disclosure may refer to any fluorocarbon based solvent with a carbon-fluorine (C—F) bond and may be interpreted as including any material in which a fluorine atom is contained in a molecule. A type of the fluorinated solvent may include any HFE based solvent such as HFE-7100 (isomeric mixture of methyl nonafluorobutyl ether and methyl nonafluoroisobutyl ether), HFE-7200 (isomeric mixture of ethyl nonafluorobutyl ether and ethyl nonafluoroisobutyl ether), HFE-7300, HFE-7500, and HFE-7600 (1,1,1,2,3,3-hexafluoro-4-(1,1,2,3,3,3-hexafluoropropoxy)-pentane).

The fluorinated solvent according to the present disclosure may include a perfluorinated solvent that refers to a material in which all hydrogen atoms of a fluorinated material are substituted with fluorine atoms and are completely fluorinated. A type of the fluorinated solvent may include any FC based solvent such as FC-40, FC-43, FC-70 (perfluorotripentylamine), FC-72 (perfluorohexane), FC-75 (perfluoro-(2-butyl-tetrahydrofuran)), FC-770, FC-3283, and FC-3284. Here, FC-40 may be composed by mixing perfluorotri-n-butylamine and perfluoro-n-dibutylmethylamine.

As described above, according to the present disclosure, a perfluorinated material of a fluorinated material may be used and, in this regard, may be very well dissolved in a perfluorinated solvent. Accordingly, according to the present disclosure, the perfluorinated solvent of the fluorinated solvent may be used.

2. Step of Forming Mask Template (First Step)

According to the present disclosure, the above fluorinated material may be printed on a surface of a substrate for a mask template. That is, according to the present disclosure, the mask template may be formed on the surface of the substrate using a printing method. The printing method may include various types of methods such as inkjet, offset, gravure, flexo, screen, direct, and reverse and the respective methods may have unique features, as partially summarized in FIG. 3. Accordingly, according to the present disclosure, a most appropriate printing method may be selected in consideration of the type, the feature, and so on of a device and/or pattern target layer to be applied.

For example, the inkjet printing method has low material consumption and excellent precision compared with other printing methods and, thus, may be directly applied to pattern an organic material using a printing process. The reverse gravure offset method has excellent resolution and, thus, may be applied to a display and a touchscreen that are high-resolution and large-area electronic devices. The screen printing method has non-high resolution and, thus, may be applied to radio frequency identification (RFID) and a solar cell that are low-resolution and large-area electronic devices.

The present disclosure may be applied to various types of substrates. That is, the present disclosure may be applied to any rigid or flexible substrate. For example, the rigid substrate may include glass, indium tin oxide (ITO) coated glass, a wafer, and so on. The flexible substrate may include plastic (polyimide (PI), polycarbonate (PC), polyethersulfone (PES), polyethylene terephthalate (PET), polyethylene naphthalate (PEN), polyarylate (PAR), and so on), paper, fiber, and so on.

The present disclosure may be applied to a nonplanar substrate as well as a planar substrate. For example, an organic lighting may be fabricated on a substrate with a curve structure.

According to the present disclosure, the mask template may be formed on the surface of the substrate using the above printing method and configured to include an exposed portion and a non-exposed portion. Here, the exposed portion may correspond to an externally exposed region of the surface of the substrate as not being printed by a fluorinated material during a printing process and the non-exposed portion may correspond to a region of the surface of the substrate, which is not externally exposed, as being printed by a fluorinated material during a printing process. Accordingly, a pattern target layer to be described later may be positioned in the exposed portion and the non-exposed portion may function as a mask for forming the pattern target layer.

3. Step of Coating Pattern Target Material (Second Step)

According to the present disclosure, an organic material, an inorganic material, or a hybrid material may be used as a pattern target material. Here, the organic material may refer to any compound that has a carbon backbone and may have various types. Representative examples of the organic material may include an organic semiconductor, a polymer semiconductor, a polymer insulator, an organic light emitting material, a conductive polymer, protein, an organometallic compound, and so on. The inorganic material may include a carbon allotrope such as grapheme, metal, metal oxide, and so on. The hybrid material may have unique physical, chemical, and mechanical features obtained by mixing advantages of an existing single material and may be divided into a composite material (in which a bond between components is a physical bond) and a hybrid material (in which a bond between components is a partial or entire chemical bond).

According to the present disclosure, surfaces of the exposed portion and the non-exposed portion may be entirely coated with the aforementioned pattern target material. However, it may not be required to entirely coat the surfaces of the exposed portion and the non-exposed portion. For example, when the inkjet printing method is used, only the exposed portion may be selectively coated. According to the present disclosure, coating may be performed using a deposition or solution process. Examples of the deposition process to which the present disclosure is applied may include chemical vapor deposition (CVD) (representatively, plasma enhanced chemical vapor deposition (PECVD)) and physical vapor deposition (PVD) (representatively, thermal evaporation vacuum deposition, sputtering, and ion beam). In addition, the solution process may include spin coating, dip coating, doctor blade, bar coating, slot die, spray, screen printing, inkjet printing, and so on.

4. Step of Forming Pattern Target Layer (Third Step)

According to the present disclosure, a step of forming a pattern target layer in an exposed portion by lifting-off a non-exposed portion using a fluorinated solvent may be performed. According to the present disclosure, a lift-off process is used to form a material of a pattern target layer on a surface of a substrate using a sacrificial layer that corresponds to a fluorinated material constituting the non-exposed portion of the mask template. That is, according to the present disclosure, the lift-off process may be used to remove a fluorinated material constituting a non-exposed portion or to simultaneously remove a pattern target material coated on a surface of the non-exposed portion using a fluorinated solvent so as to form a pattern target layer in an exposed portion. Accordingly, the lift-off process may be performed under optimal conditions in consideration of a material, a thickness, and so on of a mask template.

According to the present disclosure, during the lift-off process, a dipping process of dipping the substrate, on which the second step is performed, in a solvent for removing the sacrificial layer (fluorinated material) may be performed. In order to perform an unfailing lift-off process if possible, physical force such as additional ultrasonic vibration may be applied.

The pattern target layer according to the present disclosure may be applied to various fields by forming any one of a semiconductor pattern, an insulator pattern, a conductor pattern, an electrode pattern, a light emission pattern, and an electrical transportation pattern. For example, when the method is performed up to the third step, the pattern target layer according to the present disclosure may be applied to an oxide thin film transistor (TFT), an organic thin film transistor (OTFT), a memory, a diode, an OLED, an OLED lighting, a touchscreen panel, an RFID tag, a cell detector, or the like of a device.

5. Additional Process

A preprocessing step of preprocessing a surface of a substrate in the printable form with a fluorinated material may be further performed prior to the first step. For example, in the case of a substrate, a surface of which is not smooth, a preprocessing step for making a surface smooth may be required for coating of a pattern target material as well as for printing of a fluorinated material. In particular, an organic lighting may use a substrate such as paper and require a preprocessing step for printing.

According to the present disclosure, the first step may be performed on a functional layer formed on the surface of the substrate. For example, when a layer, which does not require a pattern between a substrate and a pattern target layer, such as a hole transport layer (HTL) of an OLED display device is required or in order to improve a function such as adhesion of a pattern target layer, the functional layer may be formed via a preprocessing step or the like.

According to the present disclosure, a curing step of curing a non-exposed portion may be further performed between the first step and the second step. Here, the curing step may be used to prevent a patterned fluorinated material from flowing down or moving by applying heat to remove some solvent contained in a fluorinated material constituting a non-exposed portion. For example, the curing step needs to be performed under a condition that does not affect the corresponding functional layer when a functional layer is pre-formed like an HTL.

According to the present disclosure, the first step to the third step may be repeatedly performed to form a pattern target layer as a multiple layer in a right and left direction or to form a pattern target layer as a multilayer in an upper and lower direction. That is, in the case of an OLED display device that requires an RGB pattern or a complicated cell detector among devices, it may be required to form a pattern target layer as a multiple layer in a right and left direction. In addition, in the case of an oxide TFT or OTFT among devices, it may be required to form a pattern target layer as a multilayer in an upper and lower direction. When the pattern target layer is formed as a multiple layer in a right and left direction or formed as a multilayer in an upper and lower direction, a printing process that does not cause physical damage in a pre-formed pattern target layer needs to be applied.

BEST MODE

Hereinafter, an orthogonal patterning method according to exemplary embodiments of the present disclosure will be described with reference to the accompanying drawings.

First Embodiment

Figure 4:
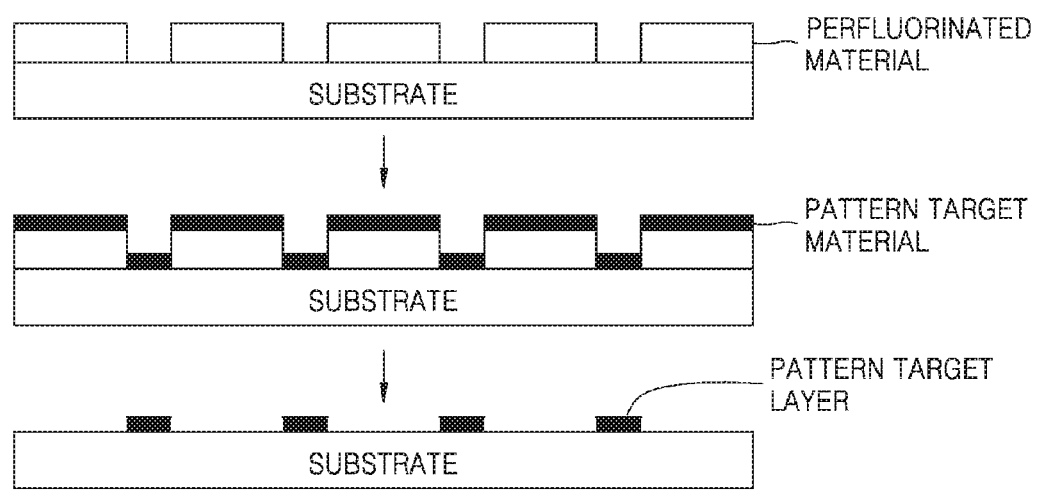
FIG. 4 is a flowchart of a method of forming an electrode using an orthogonal patterning method according to the present disclosure.

FIG. 4 is a flowchart of a method of forming an electrode using an orthogonal patterning method according to the present disclosure. As illustrated in FIG. 4, a surface of a substrate is printed with a perfluorinated material to form a mask template including an exposed portion and a non-exposed portion. In this case, the mask template may include the exposed portion and the non-exposed portion according to a desired electrode pattern. Examples of the printing may include screen printing or inkjet printing and printing may be performed to a thickness for allowing lift-off in subsequent processes.

Then, surfaces of the exposed portion and the non-exposed portion included in the mask template may be coated with a pattern target material for forming an electrode pattern using general deposition equipment or a solution process and, then, the non-exposed portion may be lifted-off using a perfluorinated solvent to form the pattern target layer in the exposed portion. That is, the perfluorinated material included in the non-exposed portion may be lifted-off using the perfluorinated solvent such that an electrode pattern that is the pattern target layer remains only in the exposed portion of the surface of the substrate.

Here, the electrode pattern may use metals, a carbon allotrope, conductive polymer, or the like. In detail, the metals may be indium, a mesh film, (Cu, Ag, Al, or Mo), metal wire (silver nano wire), or the like, the carbon allotrope may use carbon nanotube (CNT), grapheme, or the like, and the conductive polymer may use poly(3,4-ethylenedioxythiophene):polystyrene sulfonate (PEDOT:PSS), or the like.

The electrode pattern formed according to the present embodiment may be applied to various fields according to a type of the aforementioned material. For example, the electrode pattern may be applied to a radio frequency identification (RFID) tag, a touchscreen panel (TSP), or the like.

Second Embodiment

Figure 5:
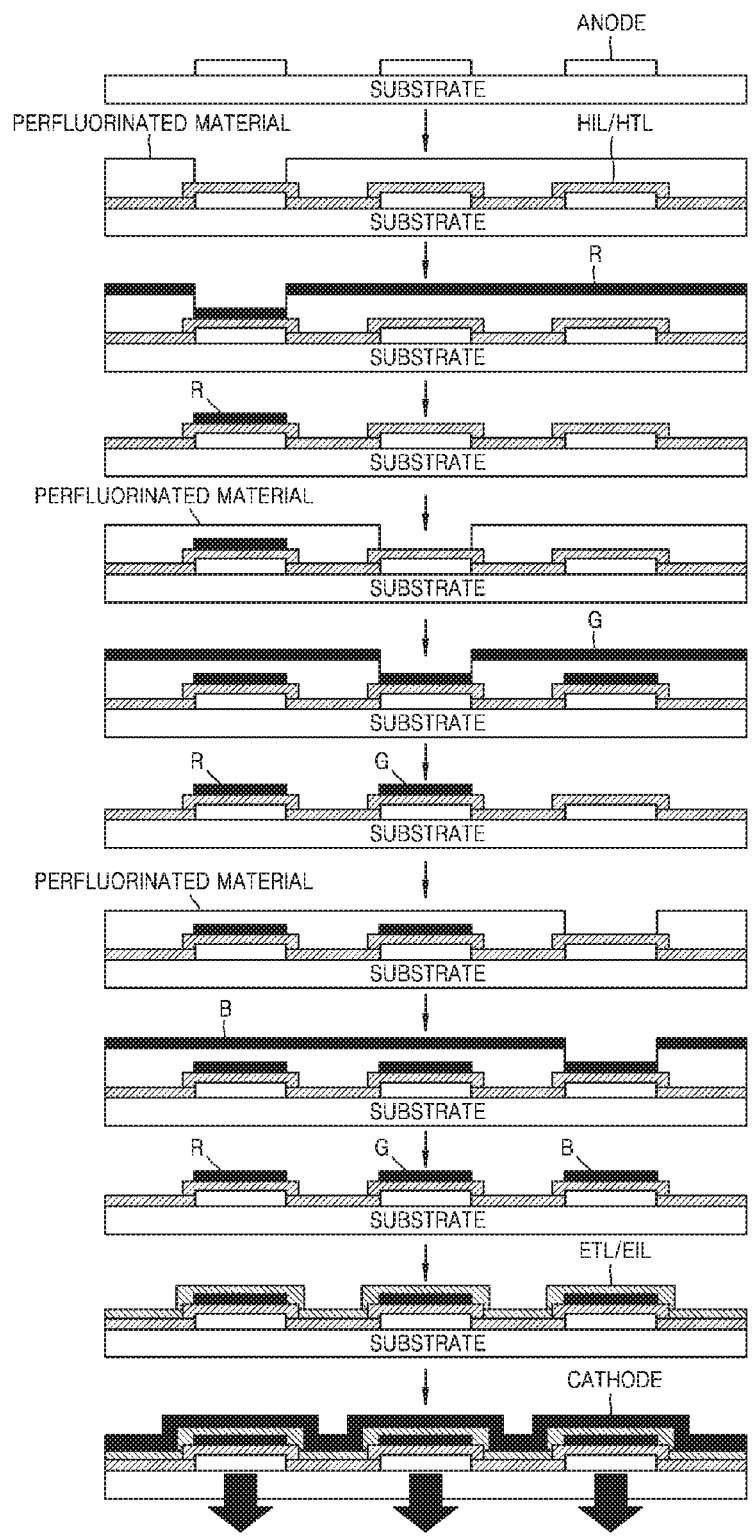
FIG. 5 is a flowchart of a method of manufacturing an organic light emitting diode (OLED) display device using an orthogonal patterning method according to the present disclosure.

FIG. 5 is a flowchart of a method of manufacturing an OLED display device using an orthogonal patterning method according to the present disclosure. As illustrated in FIG. 5, first, a preprocessing step may be performed to further include a functional layer on a surface of a substrate. Here, the functional layer may correspond to an anode, a hole injection layer (HIL), and a hole transport layer (HTL), which constitute an OLED display device and may be formed using a general method.

Then, in order to form red (R), green (G), and blue (B) pixels included in an organic emission layer (EML) on a hole injection layer (HIL), a mask template may be formed by printing a surface of a hole transport layer (HTL) with a perfluorinated material so as to expose only a portion in which any one of the red (R), green (G), and blue (B) pixels is to be formed and not to expose the other portion. In this case, the printing may include screen printing or inkjet printing and printing may be performed to a thickness for allowing lift-off in subsequent processes.

Then, surfaces of the exposed portion and the non-exposed portion included in the mask template may be coated with a pattern target material using general deposition equipment and, then, the non-exposed portion may be lifted-off using a perfluorinated solvent to form the pattern target layer in the exposed portion. That is, the perfluorinated material included in the non-exposed portion may be lifted-off using the perfluorinated solvent such that the pattern target layer remains only in the exposed portion of the surface of the hole transport layer (HTL). Here, the pattern target layer may be any one of a red (R) organic emission layer, a green (G) organic emission layer, and a blue (B) organic emission layer. FIG. 4 illustrates the case in which the red (R) organic emission layer is first formed.

As such, after the red (R) organic emission layer is formed, a surface of a hole transport layer (HTL) may be printed with a perfluorinated material using the same method as the aforementioned method so as to expose only a portion in which another one of the green (G) and blue (B) pixels is to be formed and not to expose the other portion and another organic emission layer (green (G) organic emission layer) may be formed via a process such as deposition of an organic material. Then, a last organic emission layer (blue (B) organic emission layer) may be formed through the same process as the aforementioned process so as to completely form an organic emission layer.

Then, a postprocessing step may be performed to further include a functional layer in a surface of an organic emission layer. Here, the functional layer may correspond to an electron transport layer (ETL), an electron injection layer (EIL), and a cathode, which constitute an OLED display device and may be formed using a general method.

As described above, a surface of a substrate instead of an existing mask such as an FMM may be coated with a perfluorinated material to form a mask template, an organic material may be directly deposited on the resultant structure and, then, an organic emission layer may be formed via a lift-off process using a perfluorinated solvent. Accordingly, even if a substrate is bent due to a large size, a perfluorinated material may be printed at an accurate position of a surface of a substrate and an organic material may be directly deposited at an accurate position to form an organic emission layer, thereby creating a large area of an OLED display device.

Third Embodiment

Figure 6:
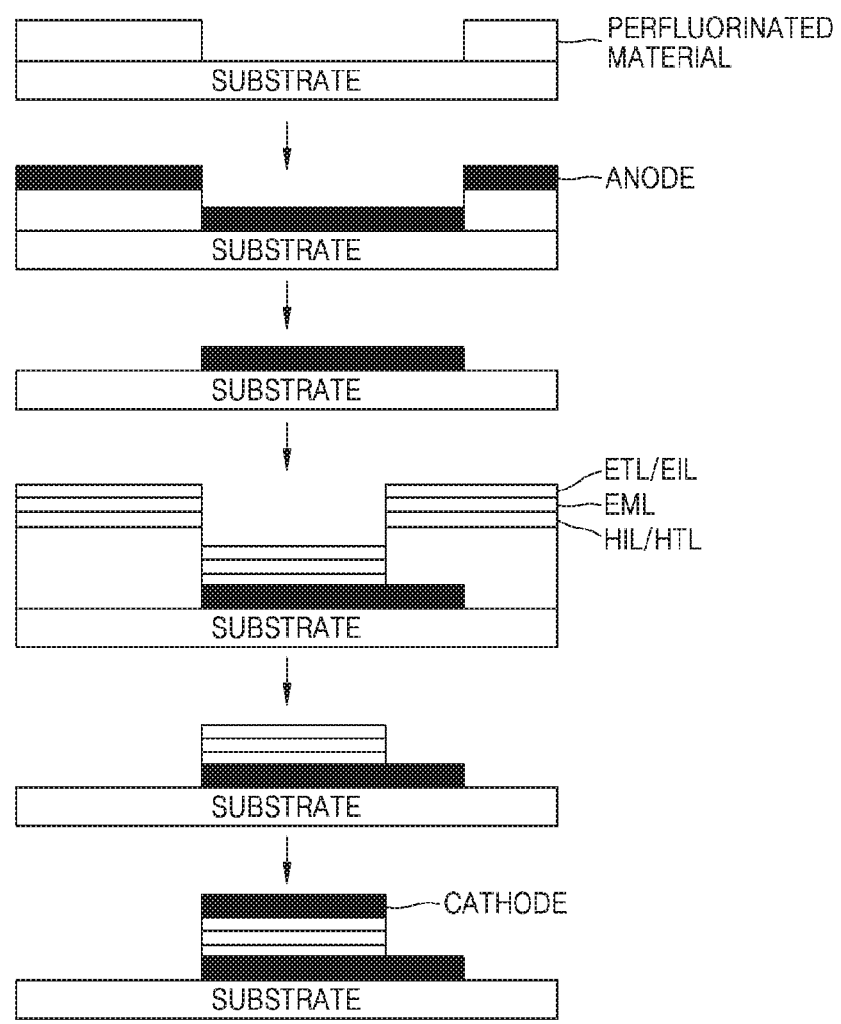
FIG. 6 is a flowchart of a method of manufacturing an OLED device including a single-color organic emission layer using an orthogonal patterning method according to the present disclosure.

FIG. 6 is a flowchart of a method of manufacturing an OLED device including a single-color organic emission layer using an orthogonal patterning method according to the present disclosure. As illustrated in FIG. 6, first, a surface of a substrate may be printed with a perfluorinated material to form a mask template including an exposed portion and a non-exposed portion. In this case, the mask template may include an exposed portion and a non-exposed portion according to a desired anode pattern. The printing may include screen printing or inkjet printing and printing may be performed to a thickness for allowing lift-off in subsequent processes.

Then, surfaces of the exposed portion and the non-exposed portion included in the mask template may be coated with a pattern target material appropriate for an anode pattern using general deposition equipment and, then, the non-exposed portion may be lifted-off using a perfluorinated solvent to form the pattern target layer in the exposed portion. That is, the perfluorinated material included in the non-exposed portion may be lifted-off using the perfluorinated solvent such that an anode that is the pattern target layer remains only in the exposed portion of the surface of the substrate.

Then, another mask template may be formed using the same concept as the aforementioned concept. In this case, the mask template may include an exposed portion and a non-exposed portion according to a desired pattern of a single-color organic emission layer.

Then, the surfaces of the exposed portion and the non-exposed portion included in the mask template may be sequentially coated with pattern target material appropriate for patterns of a hole injection layer (HIL), a hole transport layer (HTL), an organic emission layer (EML), an electron transport layer (ETL), and an electron injection layer (EIL) using a general deposition equipment and, then, the non-exposed portion may be lifted-off using a perfluorinated solvent to form the pattern target layer in the exposed portion. That is, the perfluorinated material included in the non-exposed portion may be lifted-off using a perfluorinated solvent such that the aforementioned functional layer (HIL, HTL, EML, ETL, and EIL) remains in the exposed portion of the surface of the substrate. Then, a cathode may be formed using a general method to completely form an OLED device including a single-color organic emission layer.

Fourth Embodiment

Figure 7:
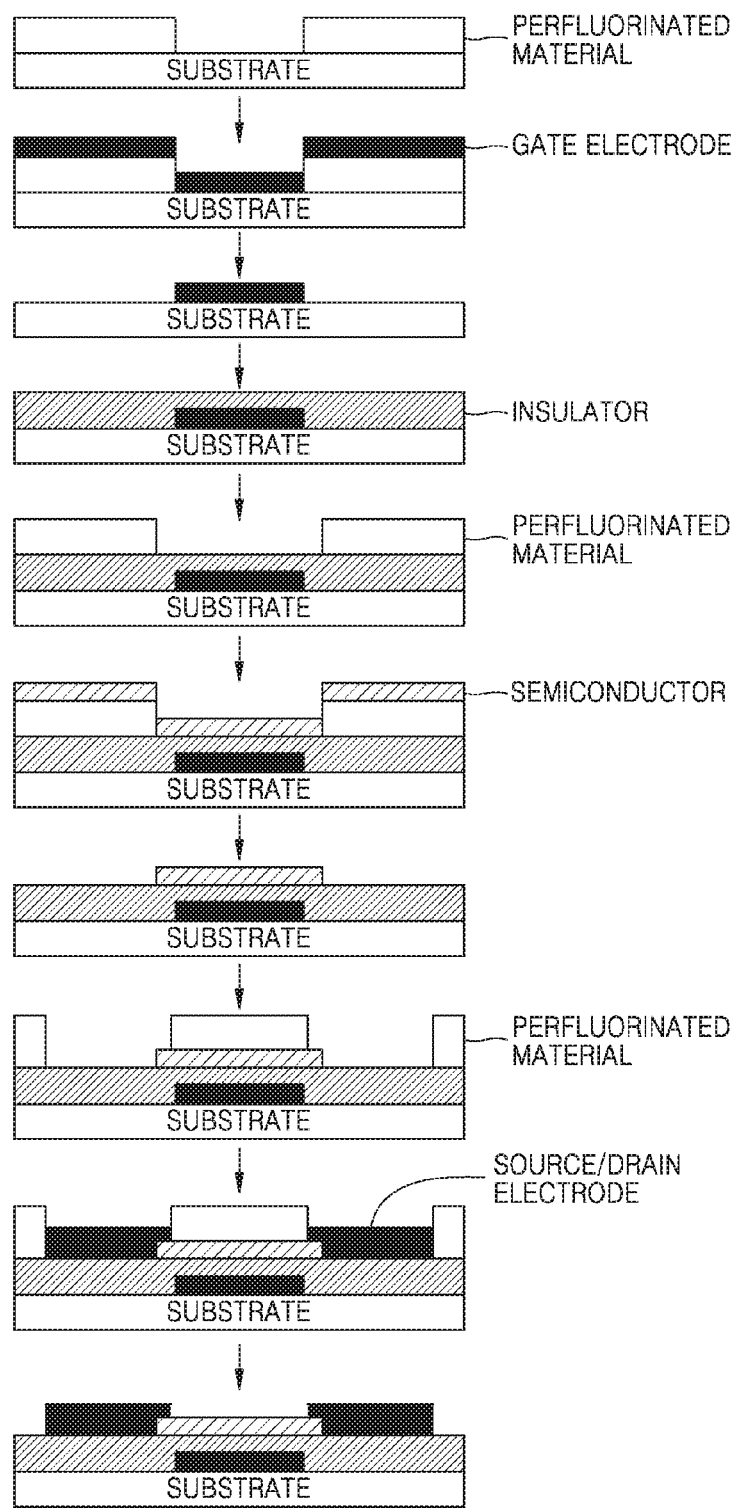
FIG. 7 is a flowchart of a method of manufacturing a thin film transistor (TFT) using an orthogonal patterning method according to the present disclosure.

FIG. 7 is a flowchart of a method of manufacturing a thin film transistor (TFT) using an orthogonal patterning method according to the present disclosure. As illustrated in FIG. 7, first, a surface of a substrate may be printed with a perfluorinated material to form a mask template including an exposed portion and a non-exposed portion. In this case, the mask template may include the exposed portion and the non-exposed portion according to a desired pattern of a gate electrode. The printing may include screen printing or inkjet printing and printing may be performed to a thickness for allowing lift-off in subsequent processes.

Then, surfaces of the exposed portion and the non-exposed portion included in the mask template may be coated with a pattern target material appropriate for a pattern of a gate electrode using general deposition equipment or a solution process and, then, the non-exposed portion may be lifted-off using a perfluorinated solvent to form the pattern target layer in the exposed portion. That is, the perfluorinated material included in the non-exposed portion may be lifted-off using the perfluorinated solvent such that a gate electrode that is the pattern target layer remains only in the exposed portion of the surface of the substrate.

Then, the surface of the substrate as well as a surface of a gate electrode may be coated with an insulator to form an insulating layer using a general method. Then, another mask template may be formed using the same concept as the aforementioned concept. In this case, the mask template may include an exposed portion and a non-exposed portion according to a desired semiconductor pattern. Then, coating using a pattern target material may be performed using the same method as the aforementioned method and, then, the non-exposed portion may be lifted-off using a perfluorinated solvent to form a semiconductor that is a pattern target layer in the exposed portion.

In addition, the mask template may be formed, the pattern target material may be coated, and the pattern target layer may be formed to form a source/drain electrode using the same concept as the aforementioned concept, thereby completely forming a thin film transistor (TFT).

Fifth Embodiment

Figure 8:
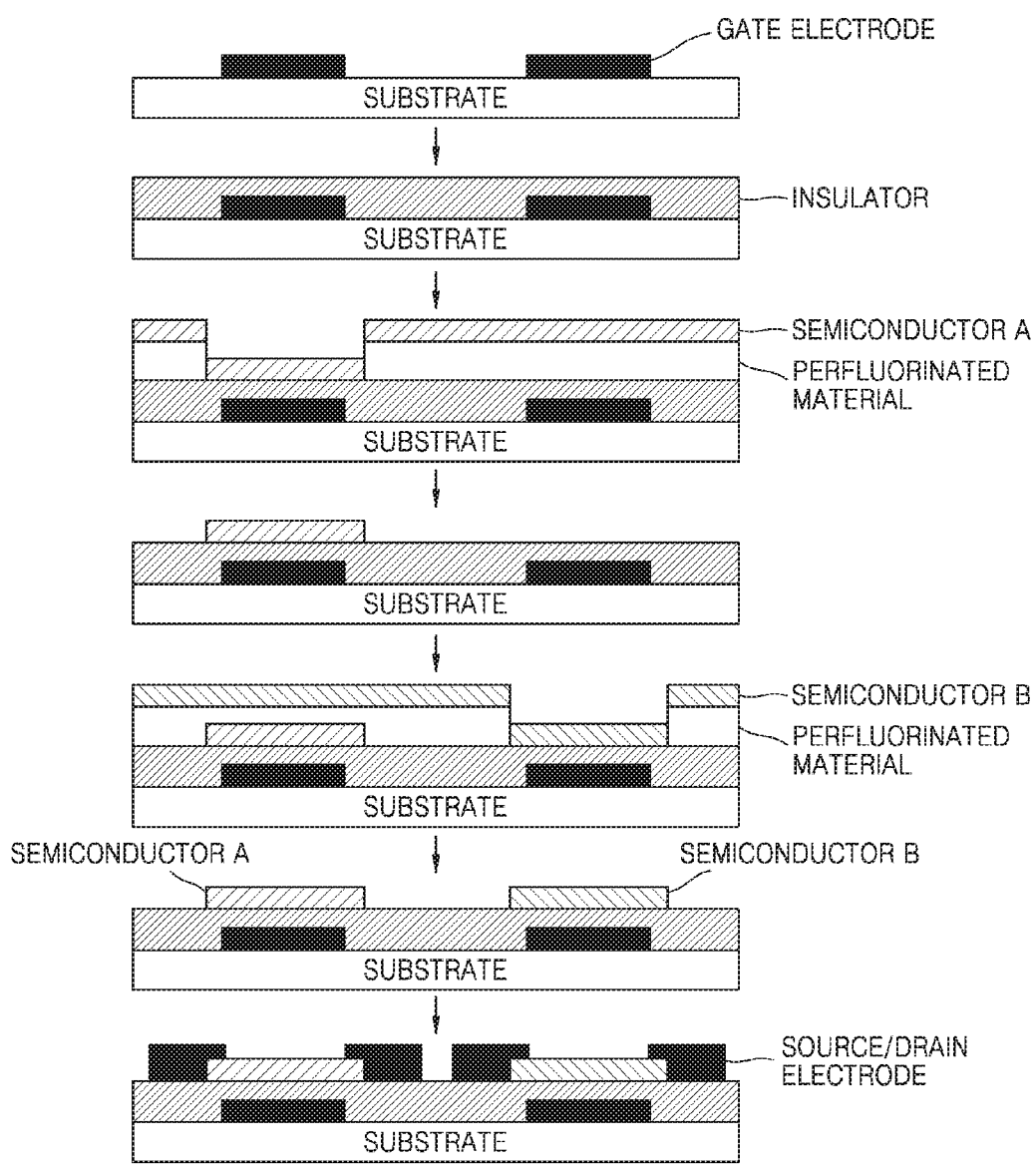
FIG. 8 is a flowchart of a method of manufacturing another thin film transistor (TFT) using an orthogonal patterning method according to the present disclosure.

FIG. 8 is a flowchart of a method of manufacturing another thin film transistor (TFT) using an orthogonal patterning method according to the present disclosure. As illustrated in FIG. 8, the TFT according to the present embodiment may include two different semiconductors (semiconductors A and B) that are connected in parallel and a gate electrode and source/drain electrodes may be configured to correspond to the semiconductors, respectively. That is, the gate electrode, the two semiconductors (semiconductors A and B), and the source/drain electrodes may be formed using the same concept as the fifth embodiment and, thus, a detailed description thereof will be omitted here.

The TFT may include a total of four structures of a top contact bottom gate (TCBG), a top contact top gate (TCTG), a bottom contact bottom gate (BCBG), and a bottom contact top gate (BCTG). That is, when a gate electrode is positioned about an insulator, this structure may be referred to as a top gate and, when the gate electrode is positioned below the insulator, this structure may be referred to as a bottom gate. In addition, when the source/drain electrodes are positioned above a semiconductor, this structure may be referred to as a top contact and when the source/drain electrodes are positioned below the semiconductor, this structure may be referred to as a bottom contact. That is, the present disclosure may be applied to the aforementioned four types of transistors.

Hereinafter, various experimental examples using an orthogonal patterning method according to the present disclosure will be described.

Experimental Example 1

Figure 9:
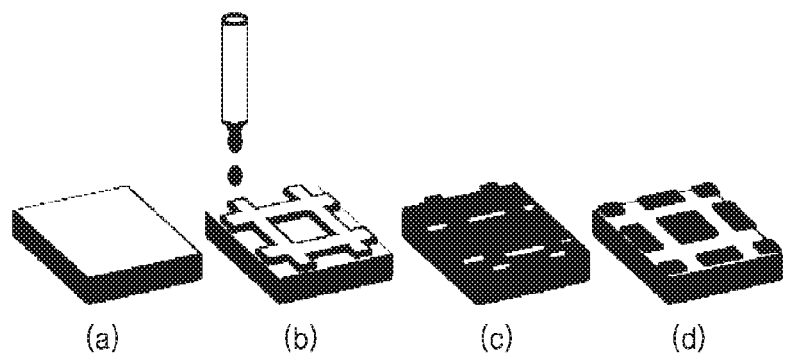
FIG. 9 is a process drawing for determining whether an oxide material is patterned using an orthogonal patterning method according to the present disclosure.

In the present experimental example, whether an oxide material is patterned may be checked using an orthogonal patterning method according to the present disclosure and the present experimental example may be performed as follows, as illustrated in a process drawing of FIG. 9. FIG. 9 is a process drawing for determining whether an oxide material is patterned using an orthogonal patterning method according to the present disclosure.

1. Step of Forming Mask Template (FIG. 9B)

CYTOP was printed on a washed silicon wafer substrate (FIG. 9A) using an inkjet method to form a mask template including an exposed portion and a non-exposed portion on a surface of a substrate. In the inkjet printing method, a nozzle may clog and, thus, a solution needs to be thin. Accordingly, in the present experimental example, CYTOP was diluted in a volume ratio of 1:10 using FC-40 (3M), which is a perfluorinated solvent. The diluted solution was loaded in an inkjet toner and ink was ejected at a hydraulic pressure of 1.4 Pa. In this case, a pressure may be changed according to the viscosity of a solution. A thickness of a thin film through inkjet printing may be about several nm. Accordingly, in order to form a thick thin film, the same operation needs to be repeatedly performed in the same position. In the present experimental example, the mask template was formed using the inkjet printing method to have a pattern interval of about 500 μm.

CYTOP used in the present experimental example was "CYTOP CTL-809M" obtained by mixing poly-1,2,4,4,5,5,6,7,7-decafluorinated-3-oxa-1,6-heptadiene according to Structural Formula 1 below and a perfluorotrialkylamine according to Structural Formula 2.

[Structural Formula 1]

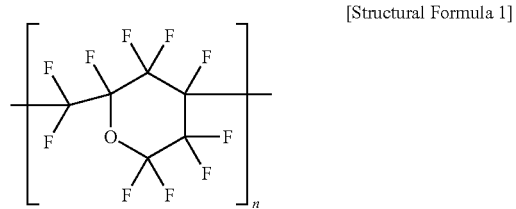

[Structural Formula 2]

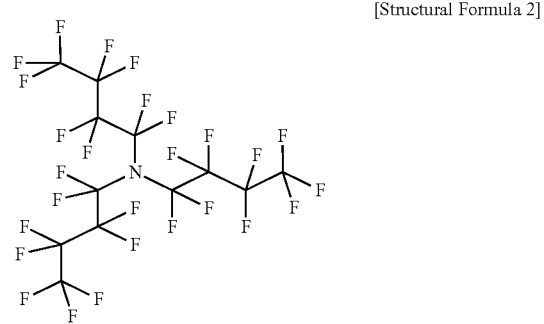

FC-40 used in the present experimental example is formed by mixing perfluorotri-n-butylamine according to Structural Formula 3 below and perfluoro-n-dibutylmethylamine according to Structural Formula 4 below.

[Structural Formula 3]

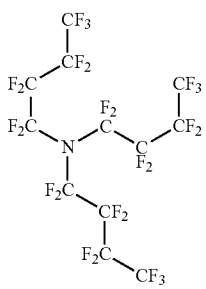

[Structural Formula 4]

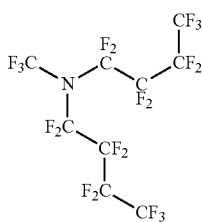

2. Curing Step

Then, a curing process of lightly heating CYTOP patterned using inkjet printing was performed at 150° C. for two minutes. The heat treatment is used to prevent the patterned CYTOP from flowing down or moving by removing a partial solvent included in the patterned CYTOP to be cured to some degree.

3. Step of Coating Pattern Target Material (FIG. 9C)

Then, surfaces of an exposed portion and a non-exposed portion which are included in a mask template were coated with a pattern target material. That is, an oxide material for allowing a solution process was coated on the entire surfaces of the exposed portion and the non-exposed portion using a printing process.

4. Step of Forming Pattern Target Layer (FIG. 9D)

Then, a substrate with an oxide material coated thereon was dipped in FC-40 to dissolve a CYTOP material included in the non-exposed portion in FC-40. That is, when the substrate with the oxide material coated thereon was dipped in FC-40 for about 10 minutes, a lift-off phenomenon in which the oxide material deposited on CYTOP included in the non-exposed portion is lifted off together may occur and, as a result, an inversely patterned oxide material remains only in the exposed portion in which CYTOP is not patterned. Then, a solvent that remains on the substrate was removed using a nitrogen gun and, then, the patterned oxide material thin film was cured at 350° C. for 90 minutes to complete patterning.

5. Result

Figure 10:
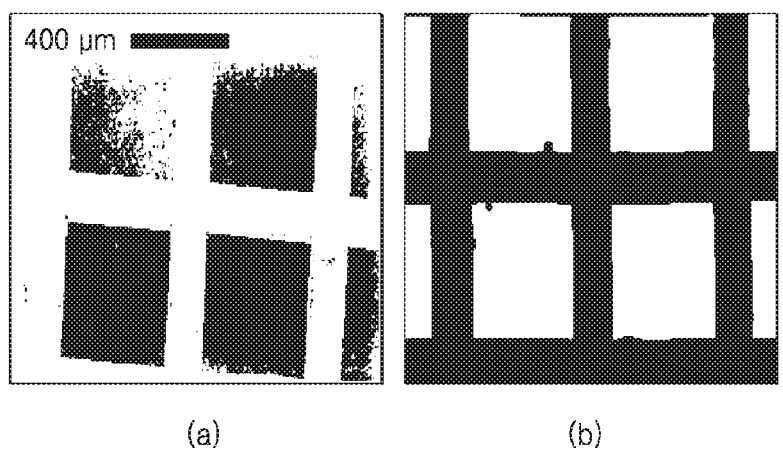
FIG. 10 is an optical microscopic image captured during the experimental process of FIG. 9.

FIG. 10 is an optical microscopic image captured during the experimental process of FIG. 9. FIG. 10A is a diagram showing an image of a state in which a non-exposed portion is patterned with a CYTOP solution via the step of forming the mask template of FIG. 9B. FIG. 10B is a diagram showing an image of a state in which a patterned oxide material remains only in an exposed portion to complete patterning via the step of forming the pattern target layer of FIG. 9D.

As seen from FIG. 10, it is possible to pattern an oxide material using an orthogonal patterning method according to the present disclosure and patterning with a high resolution and a high yield is possible as a simple printing method is applied.

Experimental Example 2

The present experimental example was performed to check whether an organic semiconductor (target: organic material for deposition) is patterned using an orthogonal patterning method according to the present disclosure and was performed as follows.

1. Step of Forming Mask Template

The present step was performed in the same way as the step of forming the mask template of Experimental Example 1.

2. Curing Step

The present step was performed in the same way as the curing step of Experimental Example 1.

3. Step of Coating Pattern Target Material

Surfaces of an exposed portion and a non-exposed portion which are included in a mask template were coated with a pattern target material. That is, pentacene that is a representative deposition-type organic semiconductor material was deposition-coated on the entire surfaces of the exposed portion and the non-exposed portion using a thermal evaporator. In this case, pentacene was slowly deposited to a thickness of about 50 nm at speed of 0.1 to 0.3 Å/s.

4. Step of Forming Pattern Target Layer

Then, a substrate with a pentacene material coated thereon was dipped in FC-40 to dissolve a CYTOP material included in the non-exposed portion in FC-40. That is, when the substrate with the pentacene material coated thereon was dipped in FC-40 for about 30 minutes, a lift-off phenomenon in which the pentacene material deposited on CYTOP included in the non-exposed portion is lifted off together may occur and, as a result, an inversely patterned pentacene material remains only in the exposed portion in which CYTOP is not patterned. In order to completely remove CYTOP, additional ultrasonic cleaning was performed for about 5 minutes. Then, a solvent that remains on the substrate was removed using a nitrogen gun to complete patterning.

5. Result

Figure 11:
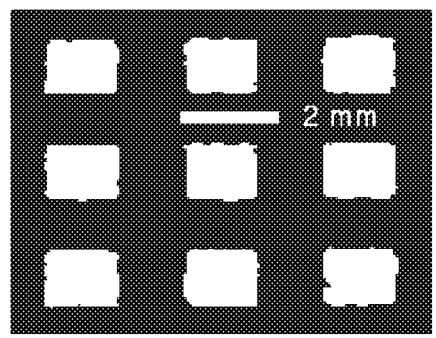
FIG. 11 is an optical microscopic image of a state in which an organic semiconductor is patterned using an orthogonal patterning method according to the present disclosure.

FIG. 11 is an optical microscopic image of a state in which an organic semiconductor is patterned using an orthogonal patterning method according to the present disclosure. As seen from FIG. 11, it is possible to pattern an organic semiconductor using an orthogonal patterning method according to the present disclosure and patterning with a high resolution and a high yield is possible as a simple printing method is applied.

Figure 12:
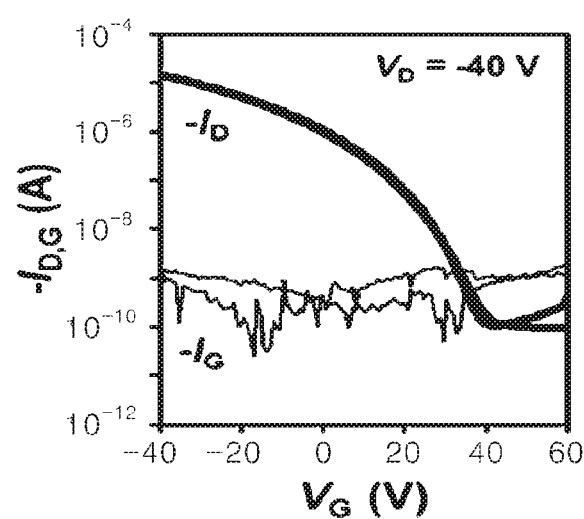
FIGS. 12 and 13 are graphs showing the electrical characteristics of a TFT device formed of an organic semiconductor (pentacene) that is patterned using an orthogonal patterning method according to the present disclosure.
Figure 13:
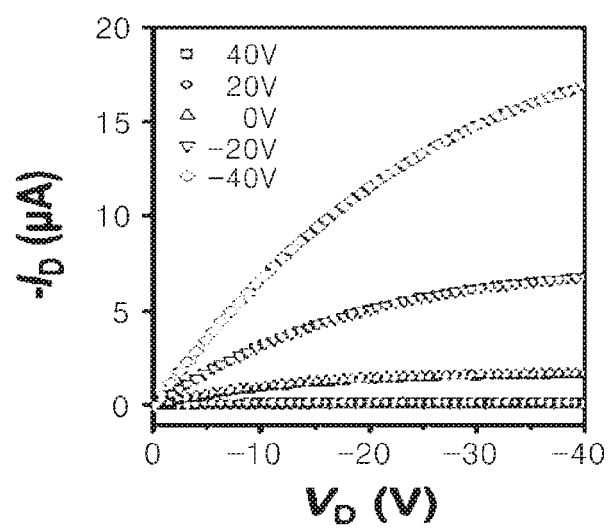

FIGS. 12 and 13 are graphs showing the electrical characteristics of a TFT device formed of an organic semiconductor (pentacene) that is patterned using an orthogonal patterning method according to the present disclosure. As seen from FIGS. 12 and 13, there were on/off characteristics that are unique characteristics of the TFT device and $I_G$ was significantly lowered and, thus, a pattern of an organic semiconductor was formed.

Figure 14:
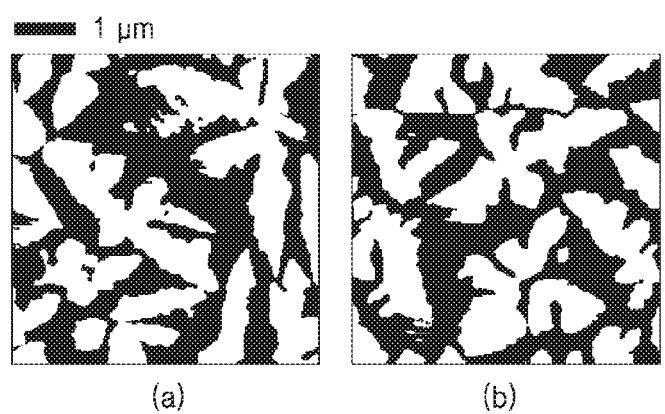
FIG. 14 shows images of comparison analysis of surfaces of a deposition-type organic material (pentacene) via atomic force microscopy (AFM) in order to check physical influence due to a fluorinated solvent used in the present disclosure.

FIG. 14 shows images of comparison analysis of surfaces of a deposition-type organic material (pentacene) via atomic force microscopy (AFM) in order to check physical influence due to a fluorinated solvent used in the present disclosure. FIG. 14A shows an AFM image of a general pentacene surface and FIG. 14B shows an AFM image of a pentacene surface processed with a fluorinated solvent used in the present disclosure. As seen from FIG. 14B, even if a surface is processed with a fluorinated solvent, there is no morphology change in the pentacene surface and, thus, the pentacene surface was nearly completely physically unaffected due to the fluorinated solvent.

Experimental Example 3

The present experimental example was performed to check whether an organic semiconductor (target: organic material for solution process) is patterned using an orthogonal patterning method according to the present disclosure and performed as follows.

1. Step of Forming Mask Template

The present step was performed in the same way as the step of forming the mask template of Experimental Example 1.

2. Curing Step

The present step was performed in the same way as the curing step of Experimental Example 1.

3. Step of Coating Pattern Target Material

Surfaces of an exposed portion and a non-exposed portion which are included in a mask template were coated with a pattern target material. That is, the entire surfaces of the exposed portion and the non-exposed portion were coated with a diketopyrrolopyrrole (DPP) derivative that is an organic semiconductor material with high carrier mobility via a solution process. In detail, the DPP derivative was spin-coated at 4000 rpm for 30 seconds.

4. Step of Forming Pattern Target Layer

Then, a substrate with a DPP derivative coated thereon was dipped in FC-40 to dissolve a CYTOP material included in the non-exposed portion in FC-40. That is, when the substrate with the DPP derivative coated thereon was dipped in FC-40 for about 10 minutes, a lift-off phenomenon in which the DPP derivative deposited on CYTOP included in the non-exposed portion is lifted off together may occur and, as a result, an inversely patterned DPP derivative remains only in the exposed portion in which CYTOP is not patterned. In order to completely remove CYTOP, additional ultrasonic cleaning was performed for about 5 minutes. Then, a solvent that remains on the substrate was removed using a nitrogen gun and, then, the patterned DPP derivative thin film was cured at 200° C. for 20 minutes in a nitrogen atmosphere to complete patterning.

5. Result

Figure 15:
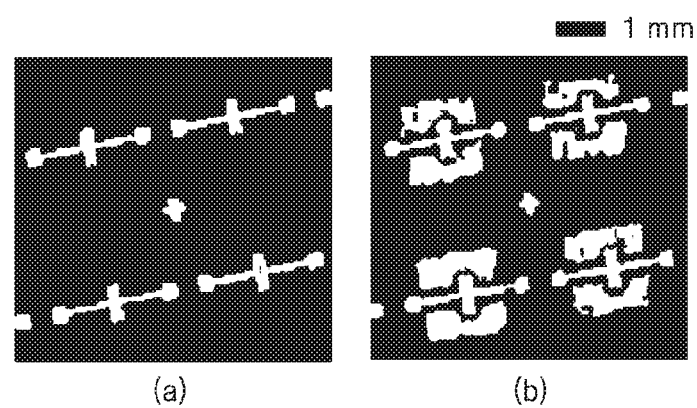
FIG. 15 shows comparison between images of organic semiconductors after and before an orthogonal patterning method according to the present disclosure is applied.

FIG. 15 shows comparison between images of organic semiconductors after and before an orthogonal patterning method according to the present disclosure is applied. FIG. 15A is a diagram showing an image of an organic semiconductor when a pattern is not formed. FIG. 15B is a diagram showing an image of an organic semiconductor in which a pattern is formed using an orthogonal patterning technology according to the present disclosure. As seen from FIG. 15B, it is possible to pattern an organic semiconductor using an orthogonal patterning method according to the present disclosure and patterning with a high resolution and a high yield is possible as a simple printing method is applied.

Figure 16:
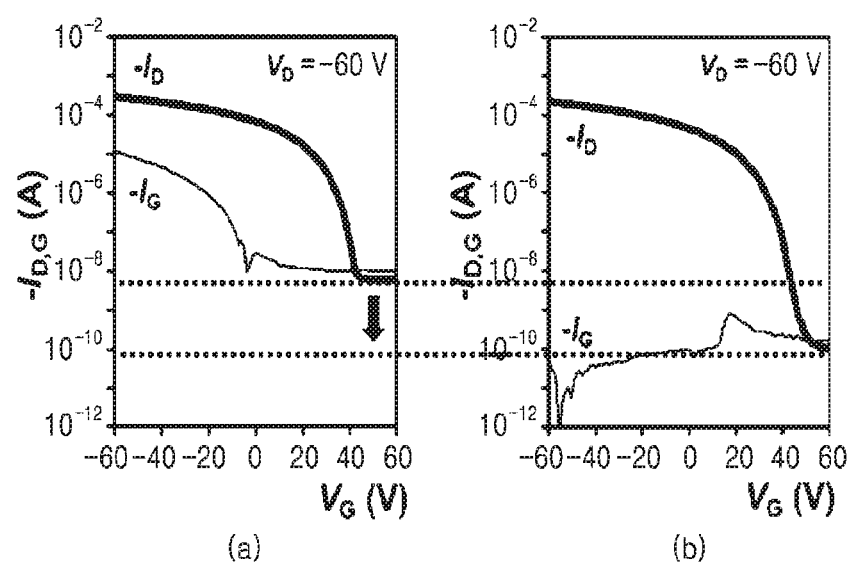
FIG. 16 is a graph showing the electrical characteristics of a TFT device formed of an organic semiconductor (DPP derivative) after and before an orthogonal patterning method according to the present disclosure is applied.

FIG. 16 is a graph showing the electrical characteristics of a TFT device formed of an organic semiconductor (DPP derivative) after and before an orthogonal patterning method according to the present disclosure is applied. FIG. 16A is a graph showing the electrical characteristics when a pattern is not formed and FIG. 16B shows the electrical characteristics when a pattern is formed using an orthogonal patterning technology according to the present disclosure. As seen from FIG. 16B, there were on/off characteristics that are unique characteristics of the TFT device and off current and $I_G$ were significantly lowered and, thus, a pattern of an organic semiconductor was formed.

Experimental Example 4

The present experimental example was performed to check whether a conductive polymer is patterned using an orthogonal patterning method according to the present disclosure and was performed as follows.

1. Step of Forming Mask Template

The present step was performed in the same way as the step of forming the mask template of Experimental Example 1.

2. Curing Step

The present step was performed in the same way as the curing step of Experimental Example 1.

3. Step of Coating Pattern Target Material

Surfaces of an exposed portion and a non-exposed portion which are included in a mask template were coated with a pattern target material. That is, poly(3,4-ethylenedioxythiophene):polystyrene sulfonate (PEDOT:PSS) that is a representative conductive polymer was coated on the entire surfaces of the exposed portion and the non-exposed portion using a solution process. In detail, PEDOT:PSS was spin-coated at 5000 rpm for 30 seconds and the PEDOT:PSS thin film was coated to a thickness of about 80 nm.

4. Step of Forming Pattern Target Layer

Then, a substrate with PEDOT:PSS coated thereon was dipped in FC-40 to dissolve a CYTOP material included in the non-exposed portion in FC-40. That is, when the substrate with PEDOT:PSS coated thereon was dipped in FC-40 for about 10 minutes, a lift-off phenomenon in which PEDOT:PSS coated on CYTOP included in the non-exposed portion is lifted off together may occur and, as a result, inversely patterned PEDOT:PSS remains only in the exposed portion in which CYTOP is not patterned. Then, a solvent that remains on the substrate was removed using a nitrogen gun and, then, the patterned PEDOT:PSS thin film was cured at 130° C. for 20 minutes to complete patterning.

5. Result

Figure 17:
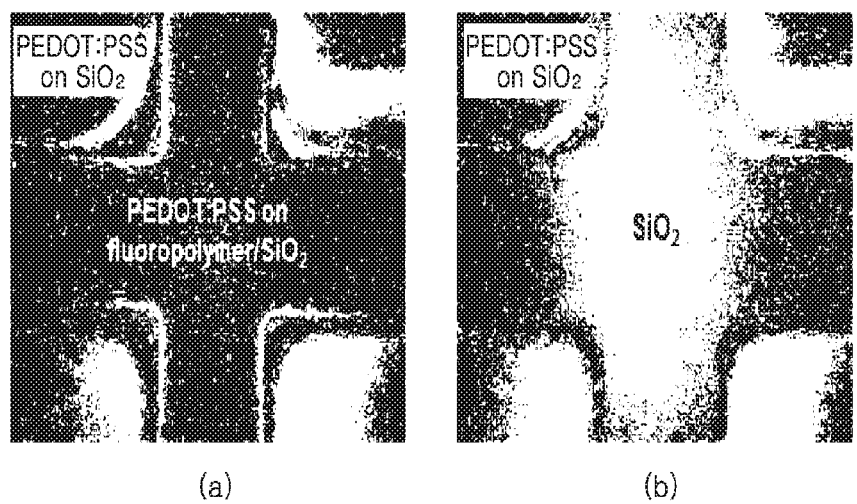
FIG. 17 is an optical microscopic image captured during the experimental process using an orthogonal patterning method according to the present disclosure.

FIG. 17 is an optical microscopic image captured during the experimental process using an orthogonal patterning method according to the present disclosure. FIG. 17A is a diagram showing an image of a state in which a step of coating a pattern target material is performed to coat PEDOT:PSS on an exposed portion and a non-exposed portion. FIG. 17B is a diagram showing an image of a state in which a step of forming a pattern target layer is performed and the patterned PEDOT:PSS remains only in the exposed portion to complete patterning.

As seen FIG. 17, it is possible to pattern PEDOT:PSS using an orthogonal patterning method according to the present disclosure and patterning with a high resolution and a high yield is possible as a simple printing method is applied.

Experimental Example 5

The present experimental example was performed to check whether metal (target: inorganic material for deposition) is patterned using an orthogonal patterning method according to the present disclosure and was performed as follows.

1. Step of Forming Mask Template

The present step was performed in the same way as the step of forming the mask template of Experimental Example 1 except that PTFE-AF was used instead of CYTOP used in Experimental Example 1. In this case, PTFE-AF was dissolved with 2 wt % in FC-40 and used.

PTFE-AF used in the present experimental example was poly[4,5-difluoro-2,2-bis(trifluoromethyl)-1,3-dioxole-co-tetrafluoroethylene] according to Structural Formula 5 below.

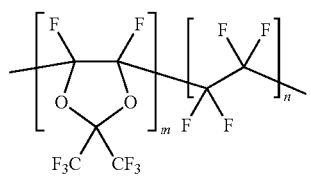

[Structural Formula 5]

2. Curing Step

A curing process of lightly heating PTFE-AF patterned using inkjet was performed at 100° C. for one minute. The heat treatment is used to prevent the patterned PTFE-AF from flowing down or moving by removing a partial solvent included in the patterned PTFE-AF to be cured to some degree.

3. Step of Coating Pattern Target Material

Surfaces of an exposed portion and a non-exposed portion which are included in a mask template were coated with a pattern target material. That is, the entire surfaces of the exposed portion and the non-exposed portion were deposition-coated with gold (Au) using a thermal evaporator. In this case, chrome (Cr) was deposited to a thickness of several nm in order to increase adhesion between the substrate and gold (Au).

4. Step of Forming Pattern Target Layer

Then, a substrate with gold (Au) coated thereon was dipped in FC-40 to dissolve a PTFE-AF material included in the non-exposed portion in FC-40. That is, when the substrate with gold (Au) coated thereon was dipped in FC-40 for about 10 minutes, a lift-off phenomenon in which gold (Au) deposited on PTFE-AF included in the non-exposed portion is lifted off together may occur and, as a result, inversely patterned gold (Au) remains only in the exposed portion in which PTFE-AF is not patterned. In order to completely remove PTFE-AF, additional ultrasonic cleaning was performed for about 10 minutes. Then, a solvent that remains on the substrate was removed using a nitrogen gun to complete patterning.

5. Result

Figure 18:
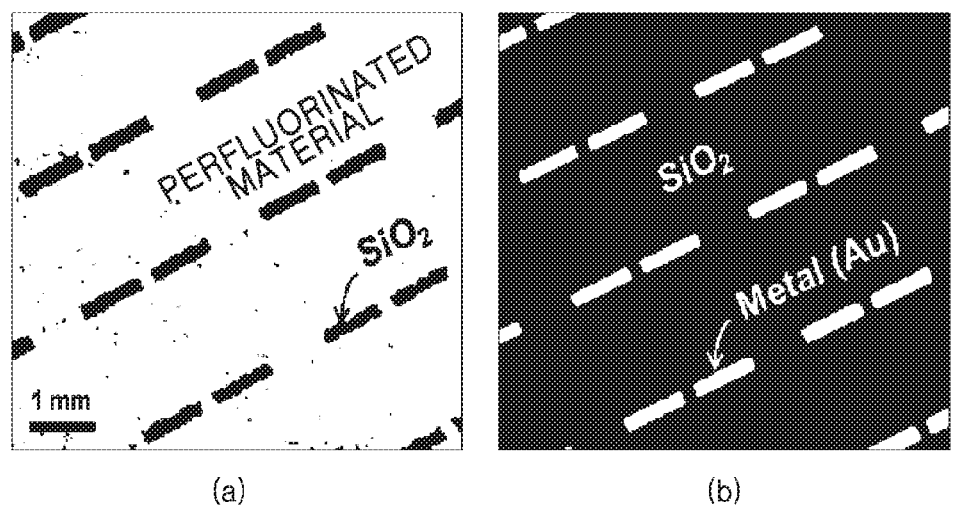
FIG. 18 is an optical microscopic image captured during an experimental process using an orthogonal patterning method according to the present disclosure.

FIG. 18 is an optical microscopic image captured during an experimental process using an orthogonal patterning method according to the present disclosure. FIG. 18A is an image of a state in which a non-exposed portion is patterned with a PTFE-AF solution via a step of forming a mask template. FIG. 18B is an image of a state in which a step of forming a pattern target layer is performed and the patterned metal (gold (Au)) remains only in the exposed portion to complete patterning. As seen from FIG. 18B, it is possible to pattern metal (gold (Au)) using an orthogonal patterning method according to the present disclosure and patterning with a high resolution and a high yield is possible as a simple printing method is applied.

Experimental Example 6

The present experimental example was performed to check whether an oxide semiconductor is patterned using an orthogonal patterning method according to the present disclosure and was performed as follows.

1. Step of Forming Mask Template

The present step was performed in the same way as the step of forming the mask template of Experimental Example 1.

2. Curing Step

The present step was performed in the same way as the curing step of Experimental Example 1.

3. Step of Coating Pattern Target Material

Surfaces of an exposed portion and a non-exposed portion which are included in a mask template were coated with a pattern target material. That is, indium gallium zinc oxide (IGZO) as a representative oxide material for allowing a solution process was coated on the entire surfaces of the exposed portion and the non-exposed portion using a printing process. In detail, IGZO was spin-coated at 4000 rpm for 30 seconds.

4. Step of Forming Pattern Target Layer

Then, the resultant structure was lightly cured at a temperature of about 70° C. and, then, a substrate with IGZO coated thereon was dipped in FC-40 to dissolve a CYTOP material included in the non-exposed portion in FC-40. That is, when the substrate with IGZO coated thereon was dipped in FC-40 for about 10 minutes, a lift-off phenomenon in which IGZO coated on CYTOP included in the non-exposed portion is lifted off together may occur and, as a result, inversely patterned IGZO thin film remains only in the exposed portion in which CYTOP is not patterned. In order to completely remove CYTOP, additional ultrasonic cleaning was performed for about 5 minutes. Then, a solvent that remains on the substrate was removed using a nitrogen gun and, then, the patterned IGZO thin film was cured at 350° C. for 90 minutes to complete patterning.

5. Result

Figure 20:
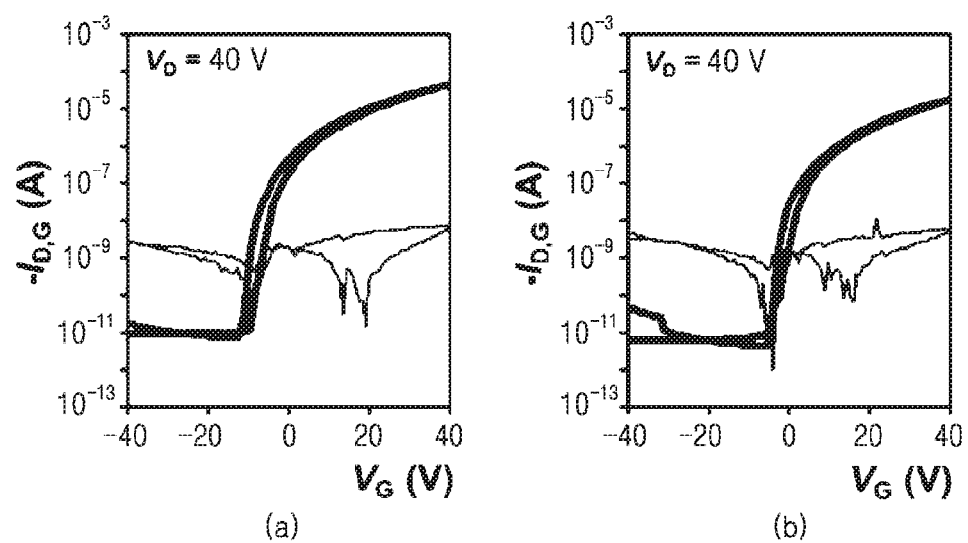
FIG. 20 includes graphs of comparison between the electrical characteristics of TFT devices formed of oxide semiconductors that are patterned using a conventional photolithography method and an orthogonal patterning method according to the present disclosure, respectively.

FIG. 19 shows optical microscopic images of a thin film of oxide semiconductors that are patterned using a conventional photolithography method and an orthogonal patterning method according to the present disclosure, respectively. FIG. 20 includes graphs of comparison between the electrical characteristics of TFT devices formed of oxide semiconductors that are patterned using a conventional photolithography method (a) and an orthogonal patterning method according to the present disclosure (b), respectively. As seen from FIGS. 19 and 20, a conventional oxide semiconductor that is generally patterned via photolithography is also patterned using the orthogonal patterning method according to the present disclosure. As such, it is possible to pattern an organic semiconductor using an orthogonal patterning method according to the present disclosure and patterning with a high resolution and a high yield is possible as a simple printing method is applied.

Experimental Example 7

The present experimental example was performed to check whether multiple patterning is performed in a right and left direction using an orthogonal patterning method according to the present disclosure and was performed as follows.

1. Step of Forming Mask Template

The present step was performed in the same way as the step of forming the mask template of Experimental Example 5.

2. Curing Step

The present step was performed in the same way as the curing step of Experimental Example 5.

3. Step of Coating Pattern Target Material

Surfaces of an exposed portion and a non-exposed portion which are included in a mask template were coated with a pattern target material. That is, pentacene, which is a representative deposition-type organic semiconductor material was deposition-coated on the entire surfaces of the exposed portion and the non-exposed portion using a thermal evaporator. In this case, pentacene was slowly deposited to a thickness of about 50 nm at speed of 0.1 to 0.3 Å/s.

4. Step of Forming Pattern Target Layer

Then, a substrate with pentacene coated thereon was dipped in FC-40 to dissolve a PTFE-AF material included in the non-exposed portion in FC-40. That is, when the substrate with pentacene coated thereon was dipped in FC-40 for about 5 minutes, a lift-off phenomenon in which pentacene deposited on PTFE-AF included in the non-exposed portion is lifted off together may occur and, as a result, inversely patterned pentacene remains only in the exposed portion in which PTFE-AF is not patterned. In order to completely remove PTFE-AF, additional ultrasonic cleaning was performed for about one minute. Then, a solvent that remains on the substrate was removed using a nitrogen gun to complete patterning of "pattern A".

5. Multiple Patterning Step

Then, in order to pattern another "pattern B" in a right and left direction (in a horizontal direction) of "pattern A", the mask template forming step, the curing step, the pattern target material coating step, and the pattern target layer forming step were sequentially performed using the same method as the aforementioned method to complete patterning of "pattern B".

6. Result

Figure 21:
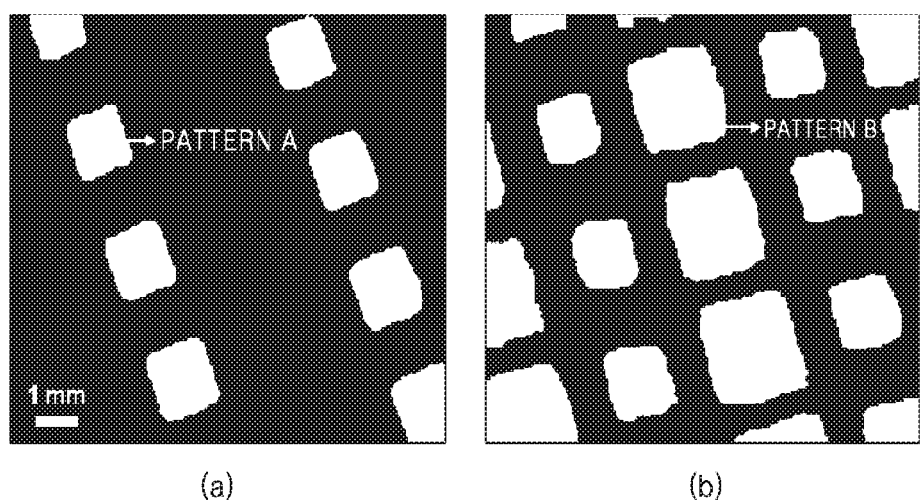
FIG. 21 is an optical microscopic image captured during an experimental process in which multiple patterning is performed in a right and left direction using an orthogonal patterning method according to the present disclosure.

FIG. 21 is an optical microscopic image captured during an experimental process in which multiple patterning is performed in a right and left direction using an orthogonal patterning method according to the present disclosure. FIG. 21A is an image of a state in which patterning of "pattern A" is completed and FIG. 21B is an image of a state in which patterning of "pattern B" is completed in the right and left direction of "pattern A". As seen FIG. 21, different multiple patterning in a right and left direction (in a horizontal direction) is possible using an orthogonal patterning method according to the present disclosure and patterning with a high resolution and a high yield is possible as a simple printing method is applied.

Experimental Example 8

The present experimental example was performed to check whether multilayer patterning is performed in an upper and lower direction using an orthogonal patterning method according to the present disclosure and was performed as follows.

1. Step of Forming Mask Template

The present step was performed in the same way as the step of forming the mask template of Experimental Example 5.

2. Curing Step

The present step was performed in the same way as the curing step of Experimental Example 5.

3. Step of Coating Pattern Target Material

Surfaces of an exposed portion and a non-exposed portion which are included in a mask template were coated with a pattern target material. That is, aluminum oxide ($Al_2O_3$) that is a representative oxide insulating material for allowing a solution process was coated on the entire surfaces of the exposed portion and the non-exposed portion using a general printing method.

4. Step of Forming Pattern Target Layer

Then, the resultant structure was lightly cured at a temperature of about 70° C. and, then, a substrate with aluminum oxide ($Al_2O_3$) coated thereon was dipped in FC-40 to dissolve a PTFE-AF material included in the non-exposed portion in FC-40. That is, when the substrate with aluminum oxide ($Al_2O_3$) coated thereon was dipped in FC-40 for about 5 minutes, a lift-off phenomenon in which aluminum oxide ($Al_2O_3$) deposited on PTFE-AF CYTOP included in the non-exposed portion is lifted off together may occur and, as a result, inversely patterned aluminum oxide ($Al_2O_3$) remains only in the exposed portion in which PTFE-AF is not patterned. A solvent that remains on the substrate was removed using a nitrogen gun to complete patterning of "pattern C".

5. Multilayer Patterning Step

Then, in order to pattern another "pattern D" in an upper and lower direction (in a vertical direction) of "pattern C", the mask template forming step, the curing step, the pattern target material coating, and the pattern target layer forming step were sequentially performed using the same method as the aforementioned method to complete patterning of "pattern D". In this case. IGZO was used as the pattern target material.

6. Result

FIG. 22 is an optical microscopic image captured during an experimental process in which multilayer patterning is performed in an upper and lower direction using an orthogonal patterning method according to the present disclosure. FIG. 22A is an image of a state in which patterning of "pattern C" is completed and FIG. 22B is an image of a state in which patterning is completed while "pattern D" is overlapped in an upper direction of "pattern C". As seen FIG. 22, different multiple patterning in an upper and lower direction (in a vertical direction) is possible using an orthogonal patterning method according to the present disclosure and patterning with a high resolution and a high yield is possible as a simple printing method is applied.

INDUSTRIAL APPLICABILITY

As seen from the above experimental examples, an organic semiconductor pattern, a conductive polymer pattern, a metal pattern, an oxide semiconductor pattern, a multiple pattern, and a multilayer pattern are formed using an orthogonal patterning method according to the present disclosure. Accordingly, according to the present disclosure, patterns for a semiconductor, an insulator, a conductor, an electrode, light emission, or electrical transportation may be formed.

When an orthogonal patterning method according to the present disclosure is performed up to the third step, the present disclosure may be applied to an oxide TFT, an OTFT, a memory, a diode, an OLED, an OLED lighting, a touchscreen panel, an RFID tag, a cell detector, or the like. When the first step to the third step are repeatedly performed in a right and left direction (in a horizontal direction), the present disclosure may be applied to an OLED display device or a complicated cell detector and, when the first step to the third step are repeatedly performed in an upper and lower direction, the present disclosure may be applied to a complicated oxide TFT or OTFT.

As such, the present disclosure may be applied to various devices with various purposes.

Thus far, the features of the multiple orthogonal patterning method according to the present disclosure have been described with reference to the accompanying drawings. However, the present disclosure described above may be variously substituted, altered, and modified by those skilled in the art to which the present disclosure pertains without departing from the scope and sprit of the present disclosure.

The invention claimed is:

1. An orthogonal patterning method of forming a pattern target layer of a device using a fluorinated material and solvent with orthogonality, the method comprising:
   a first step of printing the fluorinated material to form a mask template including an exposed portion and a non-exposed portion on a surface of a substrate the surface of the substrate further comprises a functional layer; and the first step is performed on the functional layer;
   a second step of coating the exposed portion with a pattern target material and further coating a surface of the non-exposed portion with the pattern target material; and
   a third step of lifting-off the non-exposed portion using the fluorinated solvent to form the pattern target layer on the exposed portion,
   wherein the method further comprises, prior to the first step, a preprocessing step of preprocessing the surface of the substrate in a printable form with the fluorinated material, and
   wherein the fluorinated material consists of a perfluorinated material and the fluorinated solvent consists of a perfluorinated solvent.

2. The method of claim 1, further comprising repeatedly performing the first to third steps to form the pattern target layer as a multiple layer in a right and left direction.

3. The method of claim 1, further comprising repeatedly performing the first to third steps to form the pattern target layer as a multilayer in an upper and lower direction.

4. The method of claim 1, further comprising curing the non-exposed portion between the first step and the second step.

5. The method of claim 1, wherein the perfluorinated material is obtained by mixing poly-1,1,2,4,4,5,5,6,7,7-decafluoro-3-oxa-1,6-heptadiene and perfluorotrialkylamine.

6. The method of claim 1, wherein the perfluorinated material comprises poly[4,5-difluoro-2,2-bis(trifluoromethyl)-1,3-dioxole-co-tetrafluoroethylene].

7. The method of claim 1, wherein the perfluorinated material comprises polytetrafluoroethylene (PTFE).

8. The method of claim 1, wherein the perfluorinated solvent is obtained by mixing perfluorotri-n-butylamine and perfluoro-n-dibutylmethylamine.

9. The method of claim 1, wherein the pattern target material comprises an organic material, an inorganic material, or a hybrid material.

10. The method of claim 1, wherein the substrate is rigid or flexible.

11. The method of claim 1, wherein the pattern target layer is used to form any one of a semiconductor pattern, an insulator pattern, a conductor pattern, an electrode pattern, a light emission pattern, and an electrical transportation pattern.

12. The method of claim 1, wherein the device is any one of an oxide thin film transistor (TFT), an organic thin film transistor (OTFT), a memory, a diode, an oxide light emitting diode (OLED), an OLED lighting, a touchscreen panel, an radio frequency identification (RFID) tag, and a cell detector.

13. The method of claim 3, wherein the device comprises an OLED display device or a cell detector.

14. The method of claim 4, wherein the device comprises an oxide TFT or OTFT.

15. The method of claim 1, wherein the coating in the second step is performed using a deposition or solution process.

16. The method of claim 1, wherein the surface of the substrate is planar or nonplanar.

* * * * *